United States Patent [19]
Isobe et al.

[11] Patent Number: 6,046,924
[45] Date of Patent: Apr. 4, 2000

[54] SEMICONDUCTOR MEMORY DEVICE HAVING A SENSE AMPLIFIER REGION FORMED IN A TRIPLE-WELL STRUCTURE

[75] Inventors: Katsuaki Isobe; Tsuneo Inaba, both of Yokohama, Japan

[73] Assignee: Kabushiki Kaisha Toshiba, Kawasaki, Japan

[21] Appl. No.: 09/335,751

[22] Filed: Jun. 18, 1999

[30] Foreign Application Priority Data

Jun. 19, 1998 [JP] Japan .................................. 10-172340
Jun. 18, 1999 [JP] Japan .................................. 11-171837

[51] Int. Cl.[7] ........................................................ G11C 5/02
[52] U.S. Cl. ........................ 365/51; 365/230.03; 365/208; 365/202; 365/203
[58] Field of Search ................................. 365/51, 230.03, 365/208, 202, 203

[56] References Cited

U.S. PATENT DOCUMENTS 5,774,408  6/1998  Shirley et al. .................... 365/230.03
5,875,141  2/1999  Shirley et al. .................... 365/207

FOREIGN PATENT DOCUMENTS 10-135422  5/1998  Japan .
10-200063  7/1998  Japan .

*Primary Examiner*—Andrew Q. Tran
*Attorney, Agent, or Firm*—Banner & Witcoff, Ltd.

[57] ABSTRACT

Sub-cell arrays are formed in p-type cell-forming wells, respectively, with a region between two adjacent sub-cell arrays being formed a sense amplifier circuit region which includes three wells, a first p-type well isolated from the p-type cell-forming wells, and first and second n-type wells for isolating the p-type cell-forming wells, wherein an NMOS sense amplifier is arranged in the first p-type well, a PMOS sense amplifier and a first switch circuit are arrange in one of the first and second n-type wells and a bit line equalizer circuit and a second switch circuit are arranged in the other of the first and second n-type well.

20 Claims, 20 Drawing Sheets

SEMICONDUCTOR MEMORY DEVICE HAVING A SENSE AMPLIFIER REGION FORMED IN A TRIPLE-WELL STRUCTURE

BACKGROUND OF THE INVENTION

The present invention relates to a well structure of a semiconductor memory device.

Normally, a memory cell array of a semiconductor memory device, a DRAM, for example, is divided into a plurality of blocks or sub-cell arrays, and a plurality of memory cells are arranged in each of the sub-cell arrays.

In a conventional DRAM having a plurality of sub-cell arrays, one sense amplifier is inserted between the adjacent two sub-cell arrays. In this type of DRAM, the sense amplifier is selectively connected to the bit lines of the two adjacent sub-cell arrays. In the DRAM, there is a region which is between the two adjacent sub-cell arrays and in which a sense amplifier circuit and the related circuits are formed. Such a region will be hereinafter referred to as a sense amplifier circuit region in the description below.

FIG. 1 shows a well structure of a sense amplifier circuit region of a conventional DRAM. Referring to FIG. 1, two sub-cell arrays MCA1 and MCA2 being arranged in the bit line direction and being adjacent to each other, are formed in p-type wells PWC1 and PWC2, both provided in a p-type silicon substrate Psub. In the sense amplifier circuit region SA located between the sub-cell arrays MCA1 and MCA2, there are an n-type well NW1 and two p-type wells PW1 and PW2 sandwiching the n-type well NW1.

In the p-type wells PWC1 and PWC2 where the sub-cell arrays MCA1 and MCA2 are formed, n-type wells NWB1 and NWB2 are also formed. These n-type wells NWB1 and NWB2 serve to isolate p-type wells PWC1 and PWC2 from the p-type substrate Psub and the p-type wells PW1 and PW2 of the sense amplifier circuit region SA.

The p-type wells PWC1 and PWC2 are electrically isolated by the n-type wells NWB1 and NWB2. The reason for this well structure is that the potential applied to the p-type wells PWC1 and PWC2 (where the sub-cell arrays MCA1 and MCA2 are formed) and the potential applied to the p-type wells PW1 and PW2 of the sense amplifier circuit region SA must differ from each other. To be more specific, the former potential is normally set at a negative potential so as to improve the charge holding characteristic and reduce the memory cell junction capacitance, while the latter potential is normally set at a ground potential. For this reason, it is ordinary to provide a three-well structure in a p-type silicon substrate, as shown in FIG. 1.

FIG. 2 shows the configuration of a circuit employed in the well-structure substrate shown in FIG. 1. Referring to FIG. 2, in the sub-cell arrays MCA1 and MC2A, a pair of bit lines (BL1 and bBL1; BL2 and bBL2) and word lines WL1, WL2, WL3 and WL4 are arranged, with the bit lines and the word lines intersecting each other. Dynamic memory cells MC are arranged at the intersections of these two kinds of lines. A sense amplifier circuit SA is made up of two types of sense amplifiers: one being a flip-flop type sense amplifier that employs NMOS transistors (hereinafter referred to as an NMOS sense amplifier); and the other being a flip-flop type sense amplifier that employs PMOS transistors (hereinafter referred to as a PMOS sense amplifier). The NMOS sense amplifier NSA is formed in the p-type well PW2, while the PMOS sense amplifier PSA is formed in the n-type well NW1. A column selection gate DQG is provided in the p-type well PW2, in addition to the NMOS sense amplifier NSA. A bit line equalizer circuit EQL is arranged in the p-type well PW1. In that portion of the p-type well PW1 which is closest to the sub-cell array MCA1, a switch circuit Phit1 is provided. By this switch circuit Phit1, the paired bit lines BL1 and bLB1 of the sub-cell array MCA1 are connected or disconnected from the paired bit lines BL12 and bBL12 of the sense amplifier circuit region SA. Likewise, in that portion of the p-type well PW2 which is closest to the sub-cell array MCA2, a switch circuit Phit2 is provided. By this switch circuit Phit2, the paired bit lines BL2 and bLB2 of the sub-cell array MCA2 are connected or disconnected from the paired bit lines BL12 and bBL12 of the sense amplifier circuit region SA.

Normally, in the sense amplifier circuit region SA, the PMOS sense amplifier PSA is the only element that is made of PMOS transistors. The other structural elements, namely, the bit line equalizer circuit EQL, the switch circuits Phit1 and Phit2, the column selection gate DQG, and the NMOS sense amplifiers NSA, are all made of NMOS transistors. Therefore, no element is formed in the n-type wells NWB1, NWB2 provided for isolating the well regions of the sub-cell arrays MSA1, MSA2.

As described above, no element is formed in a plurality of n-type wells used for isolating the p-type wells of the sub-cell array regions from the other p-type wells. In view of this, it is hard to say that the areas on which the n-type wells are formed are used efficiently. The larger the number of divisions of one memory cell array is, the wider will be the area required for the well isolation. This prevents efficient use of the chip area.

The present invention has been conceived in consideration of the above circumstances, and is intended to provide a semiconductor memory device which has a simple well structure and which enables efficient use of a chip area.

BRIEF SUMMARY OF THE INVENTION

To achieve the above object, the present invention provides a semiconductor memory device in which a memory cell array is divided into a plurality of sub-cell arrays and a sense amplifier circuit is arranged between adjacent ones of the sub-cell arrays, wherein the semiconductor memory device comprises first and second sub-cell arrays arranged in such a manner as to sandwich a sense amplifier circuit formation region and made of first and second one-conductivity-type wells; the sense amplifier circuit formation region is made of a third one-conductivity-type well arranged between the first and second one-conductivity-type wells and isolated therefrom, and first and second opposite-conductivity type wells are arranged between the first and second one-conductivity-type wells and the third one-conductivity-type well.

In the semiconductor memory device of the present invention, the sense amplifier comprises: a first sense amplifier which is made of an opposite-conductivity-type MOS transistor formed in the third one-conductivity-type well; and a second sense amplifier which is made of a one-conductivity-type MOS transistor formed at least in one of the first and second opposite-conductivity-type wells.

In the semiconductor memory device of the present invention, two switch circuits, by which the sense amplifier circuit is connected to the first and second sub-cell arrays or disconnected therefrom, are made of one-conductivity-type MOS transistors which are respectively formed in the first and second opposite-conductivity-type wells. Alternatively, the two switch circuits are made of opposite-conductivity-type MOS transistors which are located outside the first sense amplifier of the third one-conductivity-type well.

The switch circuits can be arranged with reference to the sense amplifier circuit in a number of ways. For example, the switch circuits may be arranged in such a manner that they sandwich both the first and second sense amplifiers of the sense amplifier circuit. In this case, both the first and second sense amplifiers are shared by the adjacent sub-cell arrays. Alternatively, only the first sense amplifier of the sense amplifier circuit may be arranged in the region sandwiched between the switch circuits. In this case, only the first sense amplifier is shared by the sub-cell arrays, and two second sense amplifiers provided such that one is located between one switch circuit and the corresponding sub-cell array and the other is located between the other switch circuit and the corresponding sub-cell array.

The bit line equalizer circuit is located in the region between the switch circuits and arranged in one of the first opposite-conductivity-type well, the second opposite-conductivity-type well and the third one-conductivity-type well. In the case where the switch circuits are normally off, another bit line equalizer circuit is arranged between each switch circuit and the corresponding sub-cell array.

Basically, the bit line equalizer comprises: a pair of precharge MOS transistors, having gates driven by a signal supplied from an equalizing signal line, for transferring potentials of a precharge power supply line to the paired bit lines; and an equalizer MOS transistor, having a gate driven by a signal supplied from the equalizing signal line, for short-circuiting the paired bit lines. To prevent the precharge power supply line from short-circuiting due to the bit lines of the undesirably short-circuiting state, a current limiting MOS transistor may be provided for the bit line equalizer circuit. Such an MOS transistor is located between the precharge MOS transistor and the precharge power supply line.

According to the present invention, three wells are arranged in the sense amplifier circuit region located between the two adjacent sub-cell arrays. Specifically, the third one-conductivity-type well isolated from the first and second one-conductivity-type wells where the first and second sub-cell arrays are formed; and the first and second opposite-conductivity-type wells for isolating the third one-conductivity-type well from the first and second one-conductivity-type wells. By making use of these three wells, the bit line equalizer circuit, the switch circuits, etc. are arranged, in addition to the sense amplifier circuit. In other words, according to the present invention, the opposite-conductivity-type wells, which are required for isolating the one-conductivity-type well of the sub-cell array, can be used as element-forming regions. Accordingly, the well structure is simple, and the chip area of the semiconductor memory device can be made good use of. The structure of the present invention i s particularly advantageous to a large-scale DRAM having a large number of sub-cell arrays.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

Figure 3:
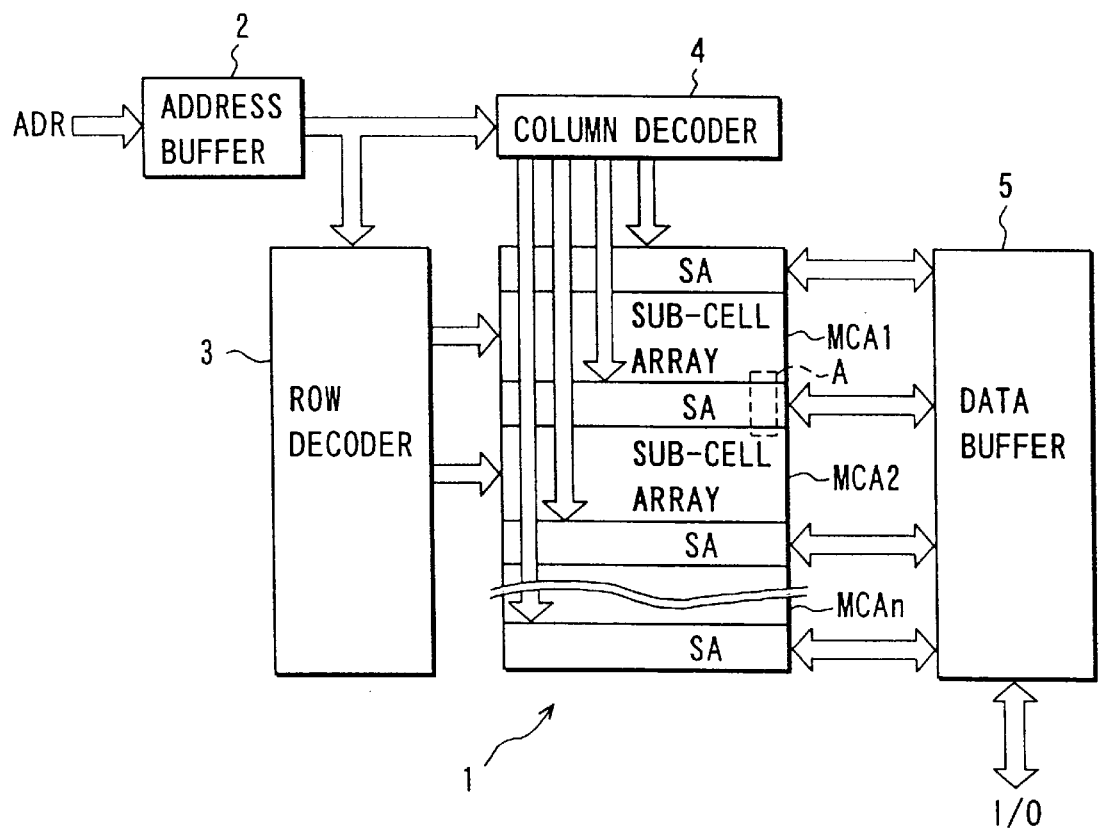
FIG. 3 is a block diagram showing the major portion of a DRAM to which the present invention is applied.

FIG. 3 is a block diagram showing the major portion of a semiconductor memory device, a DRAM, for example, to which the present invention is applied. Referring to FIG. 3, the DRAM comprises a memory cell array 1, an address buffer 2 for temporarily storing an external address ADR, row and column decoders 3 and 4 for decoding the address and selecting word and bit lines, and a data buffer 5 from which memory cell data is supplied to an external input/output terminal I/O.

As shown in FIG. 3, the memory cell array 1 is divided into a plurality of sub-cell arrays MCA1, MCA2, . . . , MCAn. The DRAM of the embodiment is a common sense amplifier type, and the regions between the adjacent sub-cell arrays MCAs serve as sense amplifier circuit regions SA.

Figure 4:
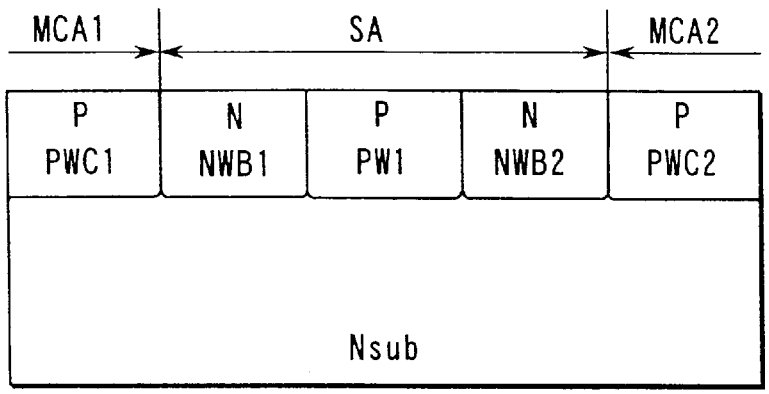
FIG. 4 is a sectional view of the sense amplifier circuit region of a DRAM according to one embodiment of the present invention.
Figure 5:
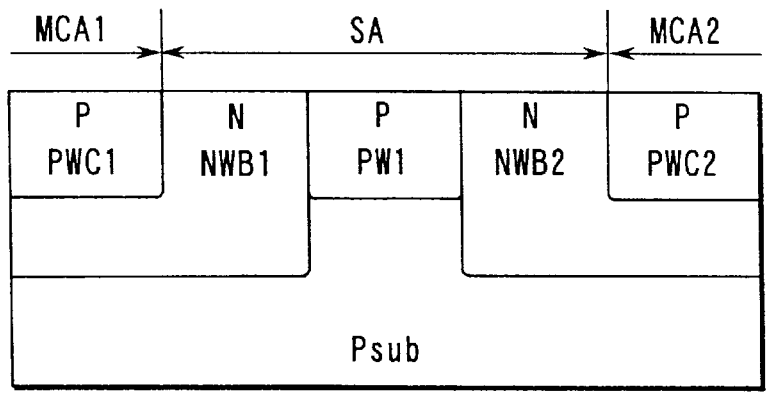
FIG. 5 is a sectional view of the sense amplifier circuit region of a DRAM according to another embodiment of the present invention.
Figure 6:
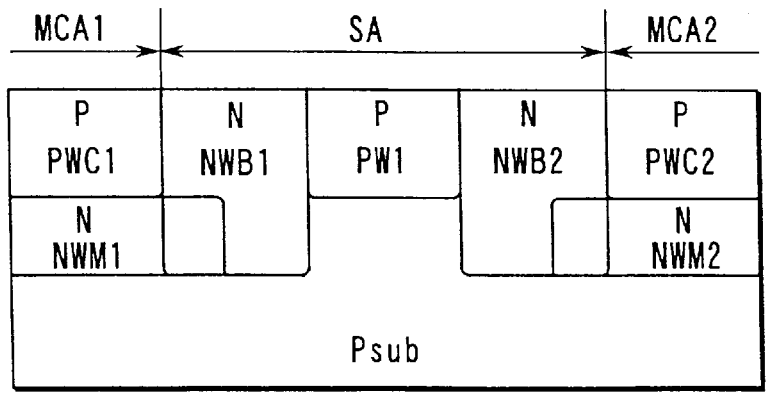
FIG. 6 is a sectional view of the sense amplifier circuit region of a DRAM according to still another embodiment of the present invention.

FIGS. 4–6 are sectional views taken along a line extending in the bit line direction and show three examples of well structures. FIGS. 4–6 are intended to illustrate two sub-cell arrays MCA1 and MCA2 which are adjacent to each other in the bit line direction of the memory cell array 1 shown in FIG. 3, as well as the sense amplifier circuit region SA (the region A indicated with the broken lines in FIG. 3) located between the sub-cell arrays MCA1 and MCA2. In descriptions below, one conductivity type and the opposite conductivity type will be referred to as a p type and an n type, respectively, for the sake of simplicity.

Referring to FIG. 4, the silicon substrate is an n type Nsub and has first and second sub-cell arrays MCA1 and MCA2. First and second p-type wells PWC1 and PWC2 are formed for the first and second sub-cell arrays MCA1 and MCA2, respectively. The region between the p-type wells PWC1 and PWC2 is a sense amplifier circuit region SA, and a third p-type well PW1 and first and second n-type wells NWB1 and NWB2 are formed in the sense amplifier circuit region SA. The third p-type well PW1 is isolated from the p-type wells PWC1 and PWC2. The first n-type well NWB1 is located between the p-type wells PWC1 and PW1, while the second n-type well NWB2 is located between the p-type wells PWC2 and PW1. The third p-type well PW1 and first and second n-type wells NWB1 and NWB2 are wells having substantially the same depth in the present embodiment.

FIG. 5 shows a well structure employing a p-type silicon substrate Psub. P-type wells PWC1 and PWC2, located in sub-cell arrays MCA1 and MCA2, are surrounded by n-type wells NWB1 and NWB2, respectively. The p-type wells PWC1, PWC2 and the n-type wells NWB1, NWB2 are formed by double diffusion. A p-type well PW1 is formed between the n-type wells NWB1 and NWB2. With this structure, the p-type wells PWC1 and PWC2 are isolated from the p-type well PW1. Each of the sub-cell arrays MCA1 and MCA2 is a three-well structure made up of: the p-type substrate Psub; the n-type well (NWB1, NWB2); and the p-type well (PWC1, PWC2).

FIG. 6 shows a modification of the structure depicted in FIG. 5. Referring to FIG. 6, n-type impurities are implanted into those regions which are directly beneath the regions where p-type wells PWC1 and PWC2 are formed later. The impurities are implanted by a high acceleration energy ion implantation process. After the ion implantation, the p-type wells PWC1 and PWC2 are formed in such a manner that they are located on the n-type wells NWM1 and NWM2. N-type wells NWB1 and NWB2 are formed in such a manner as to cover the side walls of the P-type wells PWC1 and PWC2.

Figure 7:
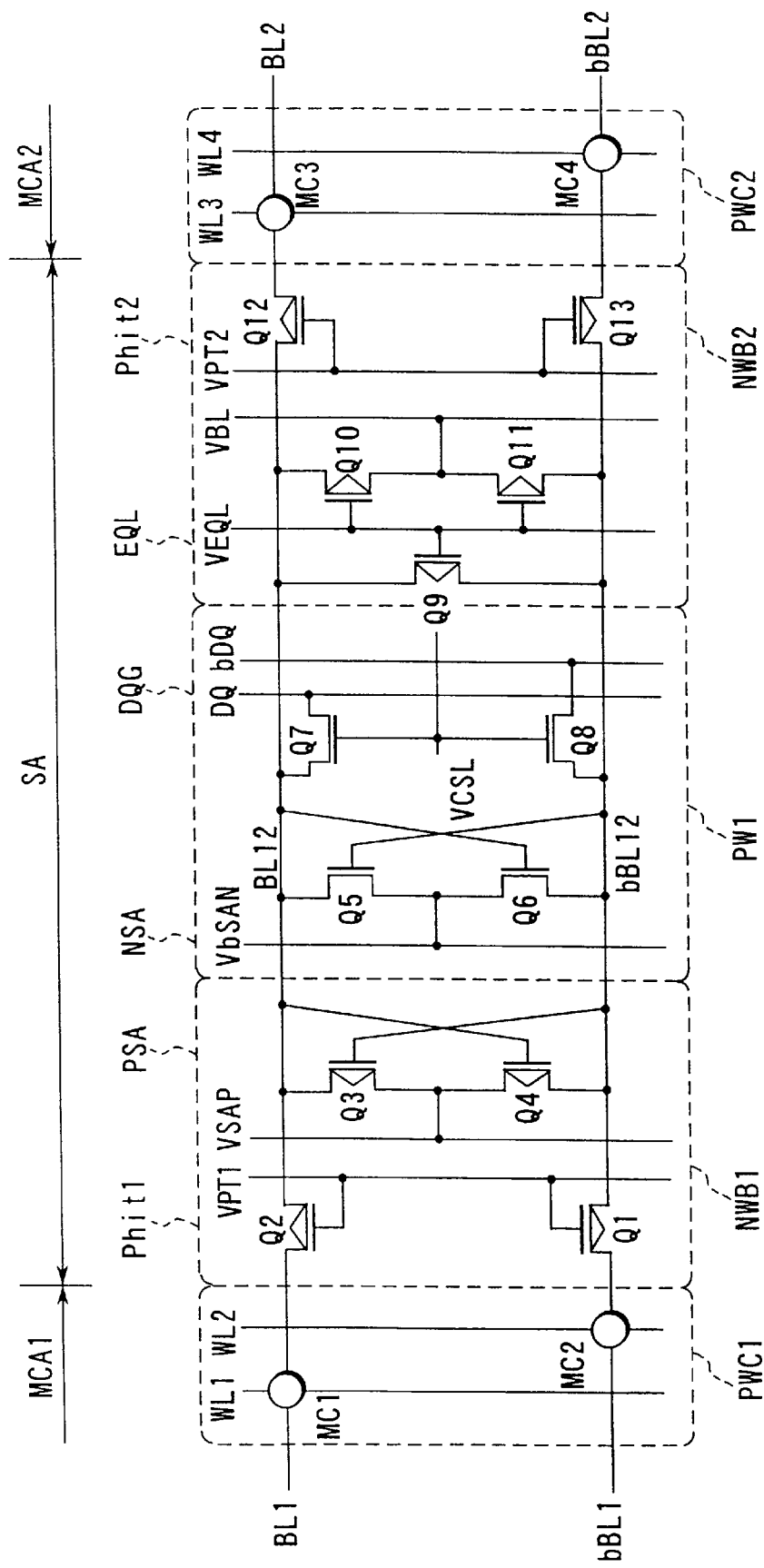
FIG. 7 shows an example of a specific circuit configuration of the sense amplifier circuit region.

FIG. 7 shows a specific circuit to be provided in the sense amplifier circuit region SA of the well structures shown in FIGS. 4–6, wherein the n-type, p-type and n-type wells are sequentially arranged in the bit line direction in the region between the p-type sub-cell array regions PWC1 and PWC2. Since the well arrangement order is the same, as shown in FIGS. 4–6, the descriptions given below is applicable to all well structures that are shown in FIGS. 4–6.

The structure of the sub-cell arrays MCA1 and MCA2 are similar to those of the conventional art. The sense amplifier circuit is made up of an NMOS sense amplifier NSA arranged in a p-type well PW1, and a PMOS sense amplifier PSA arranged in an n-type well NWB1 and adjacent to the NMOS sense amplifier NSA.

The NMOS sense amplifier NSA is a flip-flop type sense amplifier comprising two NMOS transistors Q5 and Q6. The sources of these NMOS transistors Q5 and Q6 are connected to the same actuation signal line VbSAN, the drains thereof are connected to bit lines BL12 and bBL12, respectively, and the gates thereof are connected to bit lines bBL12 and BL12, respectively.

Likewise, the PMOS sense amplifier PSA is a flip-flop type sense amplifier comprising two PMOS transistors Q3 and Q4. The sources of these PMOS transistors Q3 and Q4 are connected to the same actuation signal line VSAP, the drains thereof are connected to bit lines BL12 and bBL12, respectively, and the gates thereof are connected to bit lines bBL12 and BL12, respectively.

The bit line equalizer circuit EQL shown in FIG. 7 comprises two precharge PMOS transistors Q10 and Q11 and one equalizing PMOS transistor Q9 and is arranged in the n-type well NWB2. The sources of the precharge PMOS transistors Q10 and Q11 are connected to the same precharge power supply line VBL, the drains thereof are connected to bit lines BL12 and bBL12, respectively, and the gates thereof are connected to the same equalizing signal line VEQL. The equalizing PMOS transistor Q9 has its gate connected to the equalizing signal line VEQL, and arranged in such a manner as to short-circuit the bit lines BL12 and bBL12.

A switch circuit Phit1, used for connecting the sub-cell array MCA1 and the sense amplifier circuits PSA, NSA to each other and disconnecting them from each other, is arranged on the outer side of the PMOS sense amplifier PSA of the left-side n-type well NWB1 (the outer side being a side closer to the sub-cell array MCA1). The switch circuit Phit1 comprises PMOS transistors Q1 and Q2. Of these PMOS transistors, PMOS transistor Q2 is inserted between the bit line BL1 of the sub-cell array MCA1 and the bit line BL12 of the sense amplifier circuit region SA, and PMOS transistor Q1 is inserted between the bit line bBL1 of the sub-cell array MCA1 and the bit line bBL12 of the sense amplifier circuit region SA. The gates of the PMOS transistors Q1 and Q2 are connected to the same switch control line VPT1 and ON/OFF-controlled simultaneously.

Likewise, a switch circuit Phit2, used for connecting the sub-cell array MCA2 and the sense amplifier circuits PSA, NSA to each other and disconnecting them from each other, is arranged on the outer side of the bit line equalizer circuit EQL of the right-side n-type well NWB2 (the outer side being a side closer to the sub-cell array MCA2). The switch circuit Phit2 comprises PMOS transistors Q12 and Q13. Of these PMOS transistors, PMOS transistor Q12 is inserted between the bit line BL2 of the sub-cell array MCA2 and the bit line BL12 of the sense amplifier circuit region SA, and PMOS transistor Q13 is inserted between the bit line bBL2 of the sub-cell array MCA2 and the bit line bBL12 of the sense amplifier circuit region SA. The gates of the PMOS transistors Q1 and Q2 are connected to the same switch control line VPT2.

A column selection gate (data line transfer gate) DQG, from which the bit line data on the bit lines BL12 and bBL12 of the sense amplifier of the sub-cell array MCA1 or MCA2 is supplied to data lines DQ and bDQ, is arranged in the P-type well PW1. The column selection gate DQG comprises two NMOS transistors Q7 and Q8. One of the source and drain of NMOS transistor Q7 is connected to bit line BL12, and the other one is connected to data line DQ. One of the source and drain of NMOS transistor Q8 is connected to bit line bBL12, and the other one is connected to data line bDQ. The NMOS transistors Q7 and Q8 have their gates driven a column selection line CSL.

To read out data, for example, from sub-cell array MCA1, the equalizer circuit EQL is operated, with the switch circuits Phit1 and Phit2 being kept on, so as to equalize the potentials at the bit lines that are connected to the sense amplifier. Subsequently, switch circuit Phit2 and the equalizer circuit EQL are turned off so as to supply a read signal to the word line WL1 or WL2. As a result, data is read out from the memory cell MC1 or MC2. The readout data is amplified by a pair of sense amplifiers PSA and NSA, and the memory cell MC1 or MC2 is refreshed by the amplified data. When, in this state, the column selection gate DQG is selected, data is output to the data lines DQ and bDQ.

Figure 1:
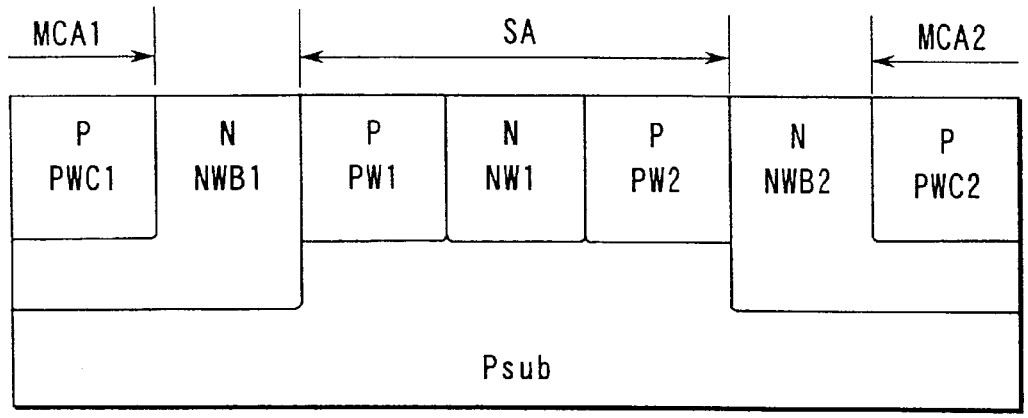
FIG. 1 is a sectional view of the wells of a sense amplifier circuit region of a conventional DRAM.
Figure 2:
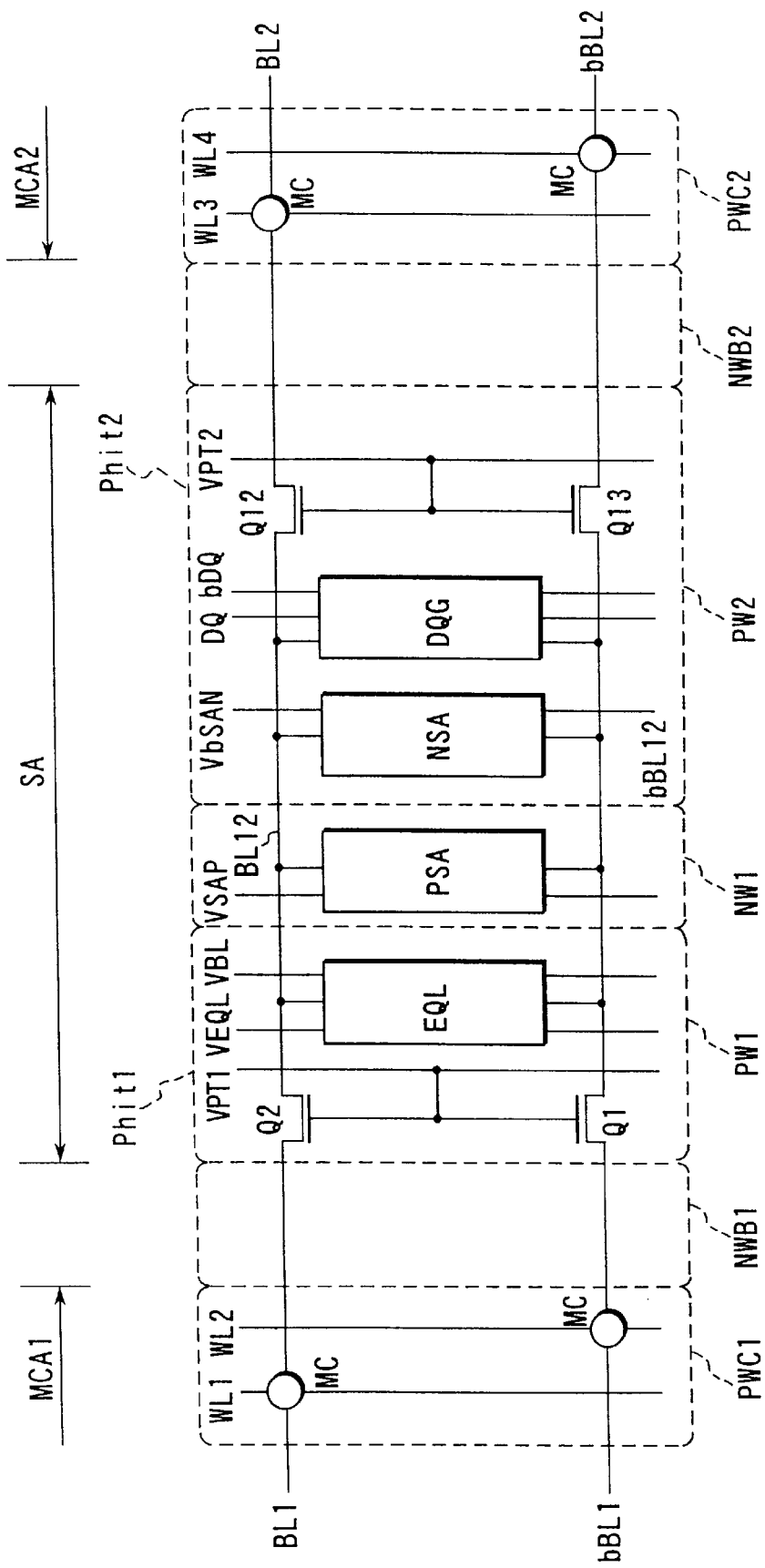
FIG. 2 shows an example of a circuit configuration of the sense amplifier circuit region of the conventional DRAM.

The advantages of the structure of the above embodiment will become apparent by comparing the structure with the conventional structures shown in FIGS. 1 and 2. In the structure of the embodiment, the p-type wells PWC1 and PWC2, in which the sub-cell arrays MCA1 and MCA2 are formed, are isolated from the other p-type wells by n-type wells NWB1 and NWB2, and these n-type wells NWB1 and NWB2 are used as element regions. To be more specific, in the case of the embodiment, not only the PMOS sense amplifier PSA but also the switch circuit Phit1 made of PMOS transistors is formed in one (NWB1) of the n-type well. Likewise, the bit line equalizer circuit EQL made of PMOS transistors and the switch circuit Phit2 also made of PMOS transistors are formed in the other n-type well (NWB2). It should be noted that in the conventional structure, the number of wells formed between the sub-cell arrays MCA1 and MCA2 and arranged in the bit line direction is five, as against three in the case of the embodiment of the present invention. Accordingly, it is possible to make good use of the chip area.

It is particularly advantageous to make the switch circuits by use of PMOS transistors. If the switch circuits Phit1 and Phit2 are made of NMOS transistors, the gates of the transistors must be driven at a boosted voltage higher than VCC, so that the data transfer at the H level (VCC level) can be performed without a voltage level drop. In the case of an NMOS transistor, even when the drain voltage VCC is transferred to the source, with the gate voltage kept at VCC, what can be actually transferred to the source is (VCC−vth) (vth: a threshold voltage). If, as in the present embodiment, the switch circuits Phit1 and Phit2 are made of PMOS transistors, it is not necessary to employ a booster circuit. To be more specific, the switch circuits Phit1 and Phit2 can be turned off when the control signal lines VPT1 and VPT2 are at VCC, and turned on when they are at VSS.

As described above, the use of the PMOS transistors for forming the switch circuits Phit1 and Phit2 is very advantageous, because this structure is attributed to the arrangement of the two n-type wells NWB1 and NWB2. That is, n-type well NWB1 is inserted between p-type well PWC1 in which sub-cell array MCA1 is formed and the p-type well PW1 in which the sense amplifier NSA is formed, and n-type well NWB2 is inserted between p-type well PWC2 in which sub-cell array MCA2 is formed and the p-type well PW1 in which the sense amplifier NSA is formed.

In the embodiment shown in FIG. 7, the PMOS sense amplifier PSA is arranged in the first n-type well NWB of the sense amplifier circuit region SA, and the bit line equalizer circuit EQL is arranged in the second n-type well NWB2. However, the PMOS sense amplifier PSA and the bit line equalizer circuit EQL can be shifted in position. That is, the PMOS sense amplifier PSA and the bit line equalizer circuit EQL can be arranged in the second n-type well NWB2 and the first n-type well NWB, respectively.

Figure 8:
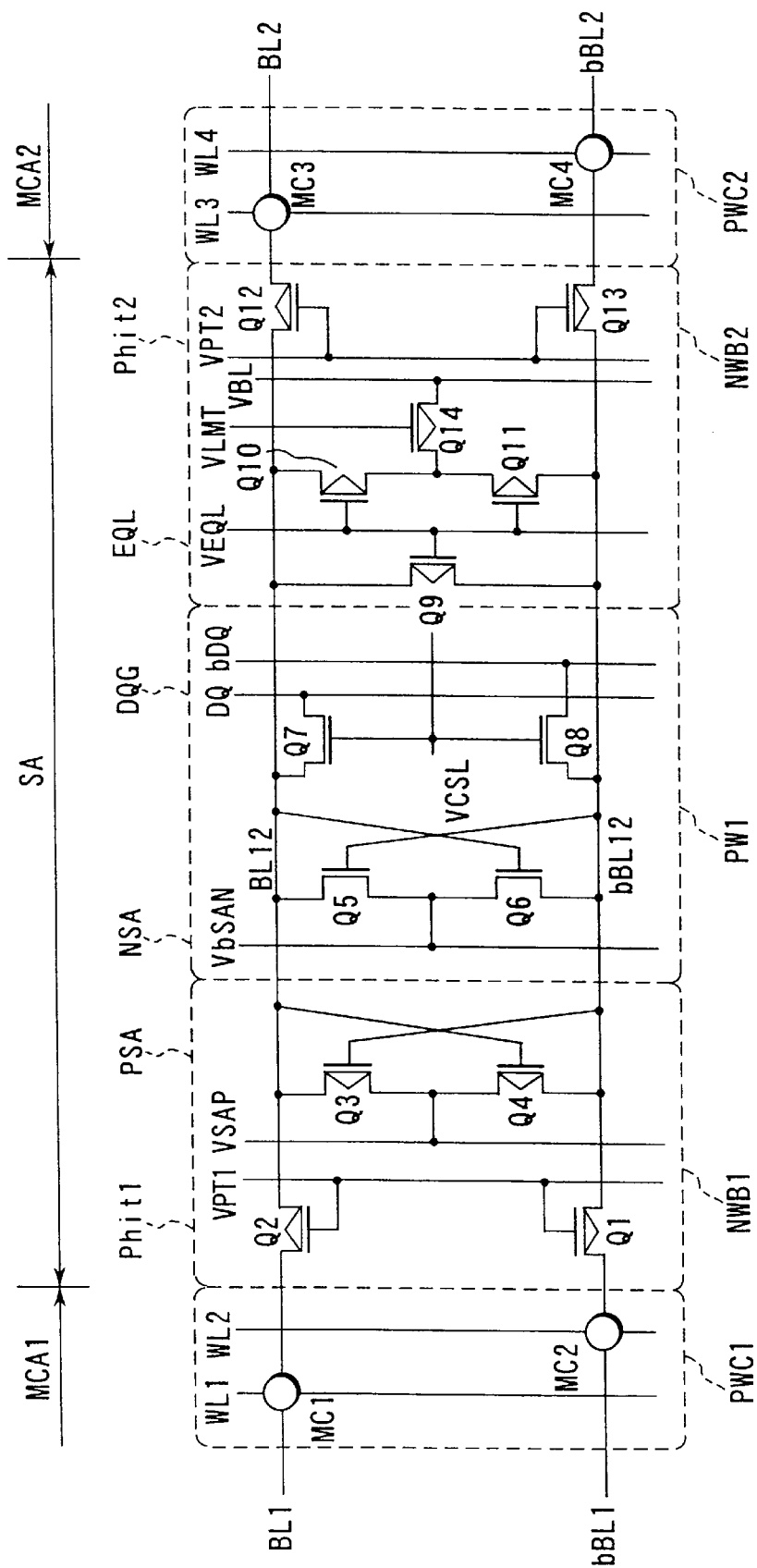
FIG. 8 shows a circuit configuration of the sense amplifier circuit region, obtained by modifying the embodiment shown in FIG. 7.

FIG. 8 illustrates an embodiment obtained by modifying the embodiment shown in FIG. 7. The embodiment in FIG. 8 is similar to that shown in FIG. 7 except that a current-limiting PMOS transistor Q14 is inserted between precharge PMOS transistors Q10, Q11 of a bit line equalizer circuit EQL and a precharge power supply line VBL. The current-limiting PMOS transistor Q14 has its gate controlled by a control line VLMT. Specifically, the control line VLMT is applied with ground potential VSS, and this allows the PMOS transistor Q14 to exhibit a high-resistance constant-current characteristic in a pentode region.

If the bit lines and the word lines short-circuit to each other, current may flow from the precharge power supply line BVL to a VSS node by way of a word line driver. The current-limiting PMOS transistor Q14 serves to restrict the amount of such current. Normally, the memory cell array of a DRAM is provided with a redundancy circuit that makes up for a defective memory cell. In this redundancy circuit system, the defective memory cell is replaced with a redundancy cell, for the reading of data. However, even the bit line connected to the defective memory cell is precharged. If the bit line equalizer circuit EQL becomes active with respect to the bit line that is connected to the defective memory cell, a large amount of short-circuit current flows from the precharge power supply unless the circuit does not have a current limiting function. The current-limiting PMOS transistor Q14 of the present invention serves to suppress such short-circuit current.

In the circuit configuration shown in FIG. 8, the PMOS sense amplifier PSA and the bit line equalizer circuit EQL may be shifted in position.

Figure 9:
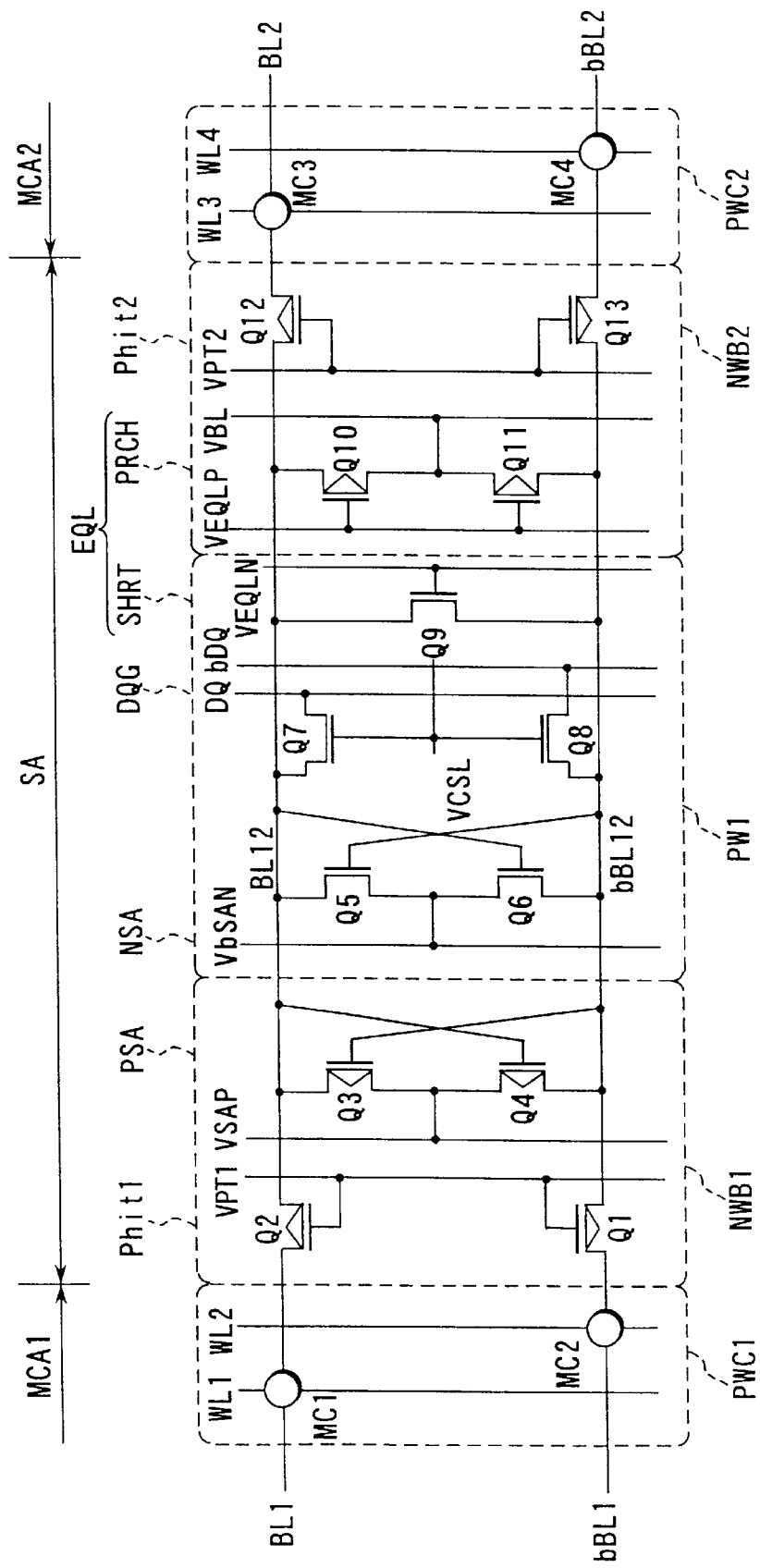
FIG. 9 shows a circuit configuration of the sense amplifier circuit region, obtained by modifying the embodiment shown in FIG. 8.

FIG. 9 illustrates an embodiment obtained by modifying the embodiment shown in FIG. 7. In the embodiment shown in FIG. 9, a bit line equalizer circuit EQL is formed in such a manner that it is located in both an n-type well NWB2 and a p-type well PW1. To be more specific, the circuit portion serving as a precharge circuit PRCH is made up of PMOS transistors Q10 and Q11 formed in an n-type well NWB2, while the circuit portion serving as an equalizer circuit SHRT is made of a MOS transistor Q9 which is formed in a p-type well PW1 and functions as an N-channel. In the case of the embodiment shown in FIG. 9, two equalizer signals lines VEQL (each of which is similar to the one shown in FIG. 7) are required, one being a signal line VEQLN connected to the NMOS transistor Q9, and the other being a signal line VEQLP connected to the gates of the PMOS transistors Q10 and Q11. The reason why the equalizer signals lines VEQL must be two is that the ON/OFF control of the NMOS transistor and the ON/OFF control of the PMOS transistors Q10 and Q11 have to be performed independently of each other.

As described above, the circuit elements of one circuit, such as the equalizer circuit EQL, can be arranged in both the p-type well PW1 and the n-type well NWB2 that are adjacent to each other. With this structure, the circuit elements can be formed in the wells in an optimal manner. For example, appropriate conductivity types of transistors can be determined, and an adequate number of elements can be provided in each well.

In the circuit configuration shown in FIG. 9, the PMOS sense amplifier PSA and the precharge circuit PRCH may be shifted in position.

Figure 10:
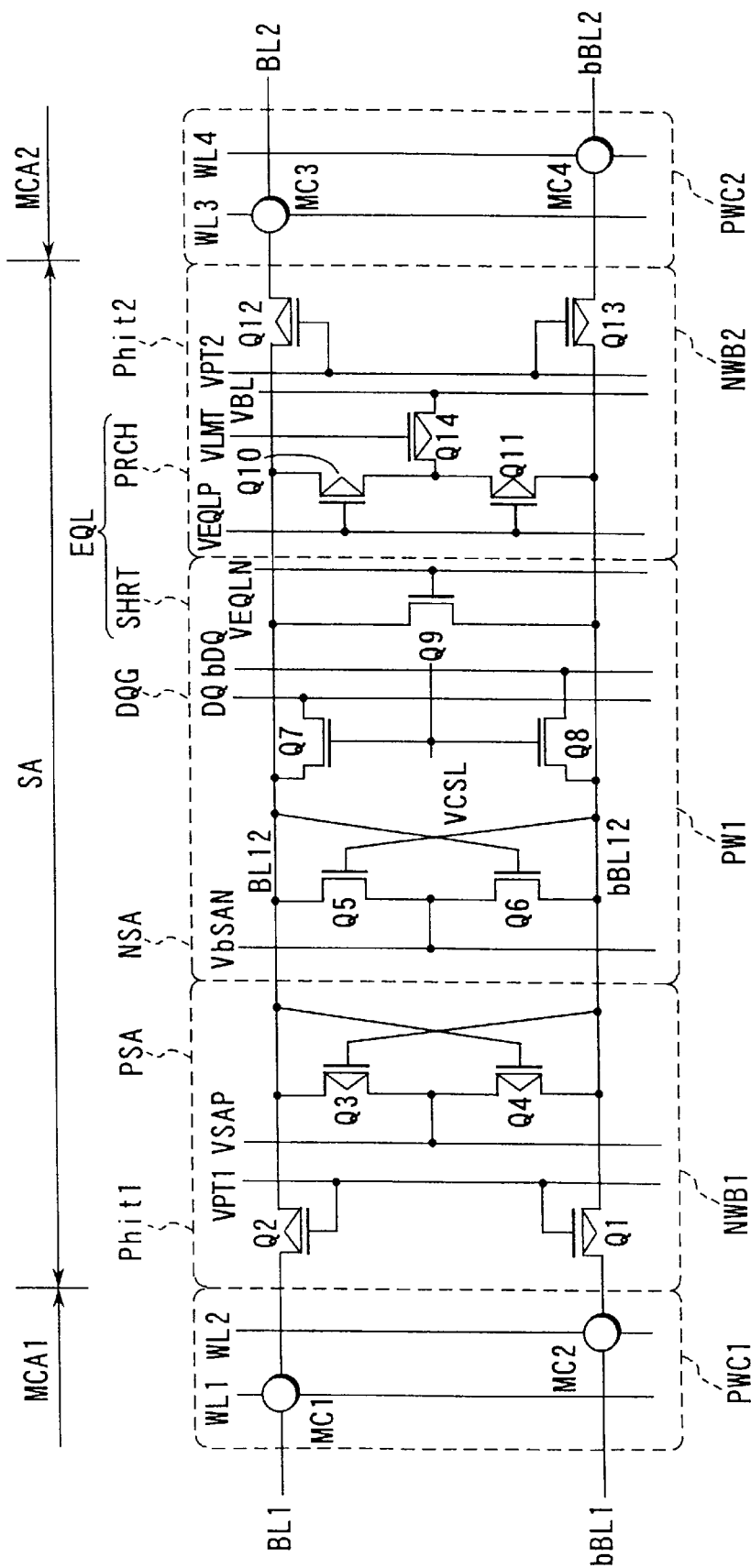
FIG. 10 shows a circuit configuration of the sense amplifier circuit region, obtained by modifying the embodiment shown in FIG. 9.

FIG. 10 illustrates an embodiment obtained by modifying the embodiment shown in FIG. 9. In the embodiment shown in FIG. 10, a current-limiting PMOS transistor Q14 is added to the precharge circuit PRCH, as in the embodiment shown in FIG. 8.

The embodiments shown in FIGS. 9 and 10 are similar to the embodiment shown in FIG. 7, except that a control signal is simultaneously supplied to both the signal lines VEQLN and VEQLP so that the NMOS transistor Q9 and PMOS transistors Q10 and Q11 can be ON/OFF-controlled simultaneously. Therefore, no further descriptions will be given with respect to the embodiments shown in FIGS. 9 and 10.

In the embodiments described so far, one bit line equalizer circuit EQL is arranged in the sense amplifier circuit region SA such that it is located between the switch circuits Phit1 and Phit2. However, in the case where the switch circuits Phit1 and Phit2 are controlled in the normally-off mode (in which the switch circuits Phit1 and Phit2 are turned on only when data is sensed), an additional bit line equalizer circuit must be provided on the outer sides of the switch circuits Phit1 and Phit2, i.e., in the regions between the switch circuits Phit1, Phit2 and the corresponding sub-cell arrays MCA1, MCA2.

Figure 11:
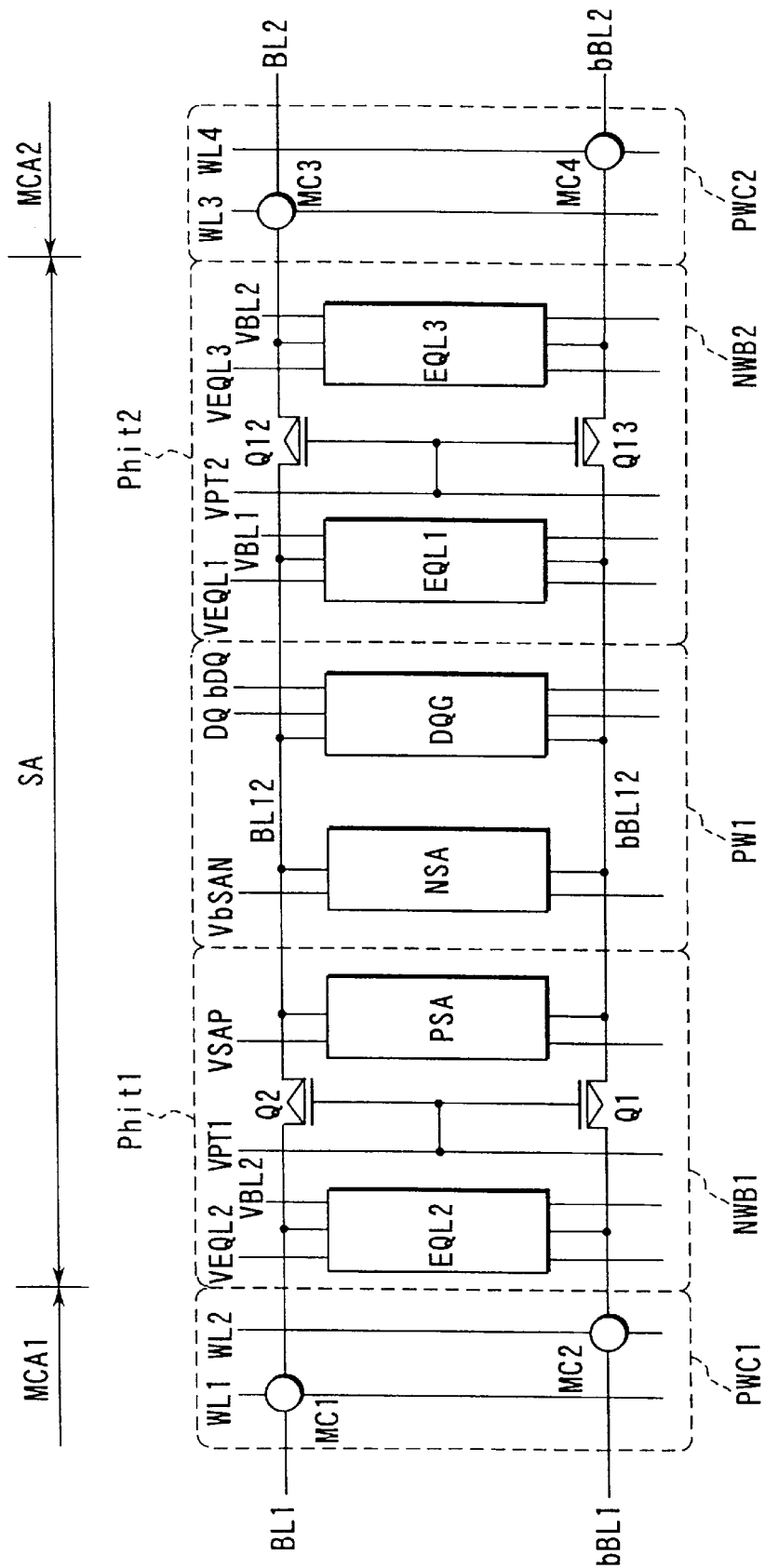
FIG. 11 shows a circuit configuration of the sense amplifier circuit region, which is according to another embodiment of the present invention.

FIG. 11 shows an embodiment employing such additional bit line equalizer circuits. Referring to FIG. 11, a first bit line equalizer circuit EQL1 is arranged in an n-type well NWB2 such that it is located between switch circuits Phit1 and Phit2, as in the embodiment shown in FIG. 7. A second bit line equalizer circuit EQL2 is arranged on the outer side of the switch circuit Phit1 of the left n-type well NWB1. Likewise, a third bit line equalizer circuit EQL3 is arranged on the outer side of the switch circuit Phit2 of the right n-type well NWB2.

The operation of the embodiment shown in FIG. 11 will be described, referring to the case where data is read out from sub-cell array MCA1, for example. Since, in this case, switch circuits Phit1 and Phit2 are in the normally-off state, all three equalizers EQL1 to EQL3 are driven, thereby equalizing the potentials of all bit lines. In this state, a read signal is supplied to the word line WL1 or WL2. Simultaneous with this, switch Phit1 is turned on, so that the data read out from the memory cell MC1 or MC2 is supplied to sense amplifier circuits PSA and NSA and amplified thereby. The memory cell MC1 or MC2 is refreshed by the amplified data. When column selection gate DQG is selected, the data is output to an external circuit.

Figure 12A:
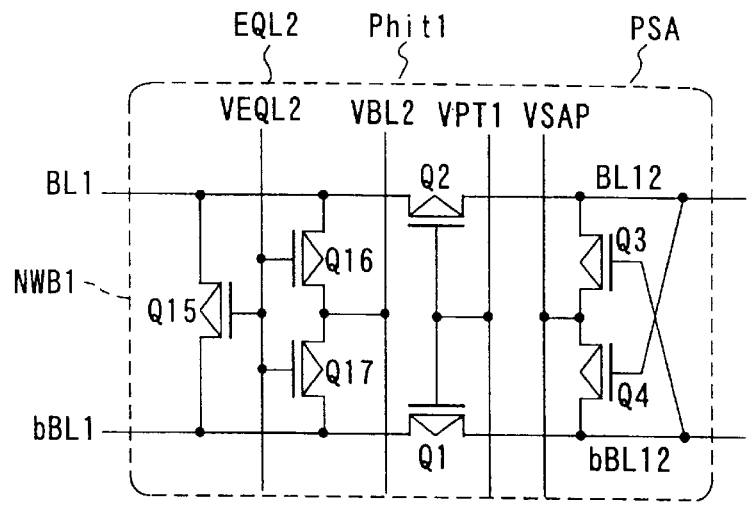
FIG. 12A shows an example of a specific circuit configuration of an n-type well NWB1 employed in the embodiment shown in FIG. 11.
Figure 12B:
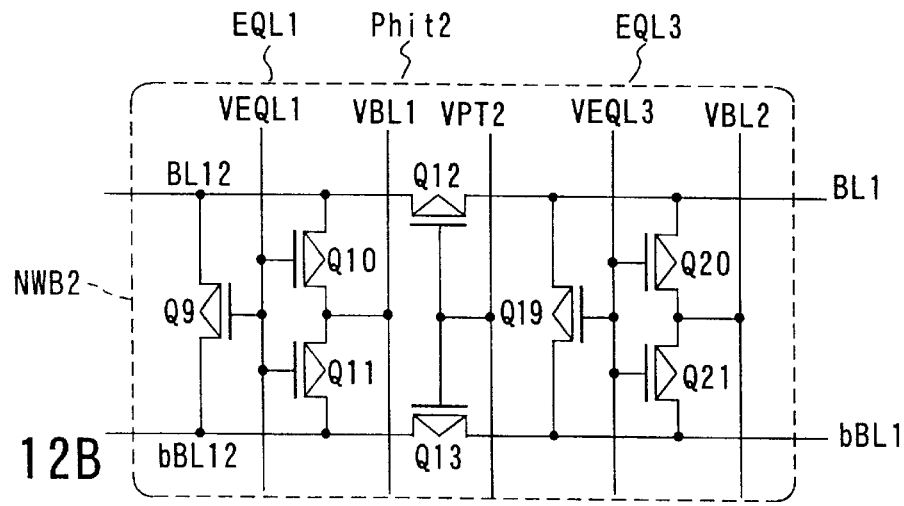
FIG. 12B shows an example of a specific circuit configuration of an n-type well NWB2 employed in the embodiment shown in FIG. 11.

FIGS. 12A and 12B show an example of a specific circuit configuration of n-type wells NWB1 and NWB2. In principle, the circuit configuration is similar to that shown in FIG. 7. As shown in FIGS. 12A and 12B, the second bit line equalizer circuit EQL2 is made up of precharge PMOS transistors Q16 and Q17 and an equalizer PMOS transistor Q15. Likewise, the third bit line equalizer circuit EQL3 is made up of precharge PMOS transistors Q20 and Q21 and an equalizer PMOS transistor Q19.

In the embodiment shown in FIG. 11, the first bit line equalizer circuit EQL1 performs a precharge/equalize operation with respect to the bit lines BL12 and bBL12 of the sense amplifiers circuit region SA. The second bit line equalizer circuit EQL2 performs a precharge/equalize operation with respect to the bit lines BL1 and bBL1 of the sub-cell array MCA1. The third bit line equalizer circuit EQL3 performs a precharge/equalize operation with respect to the bit lines BL2 and bBL2 of the sub-cell array MCA2.

Figure 13A:
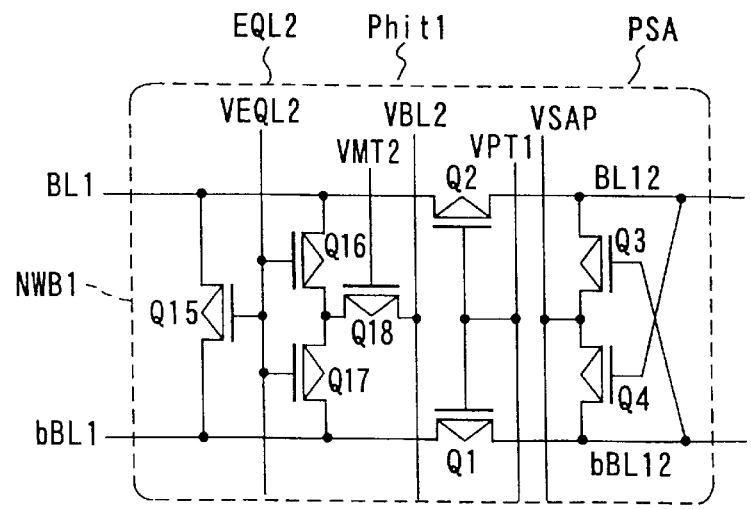
FIG. 13A shows an example of another circuit configuration of the n-type well NWB1 employed in the embodiment shown in FIG. 11.
Figure 13B:
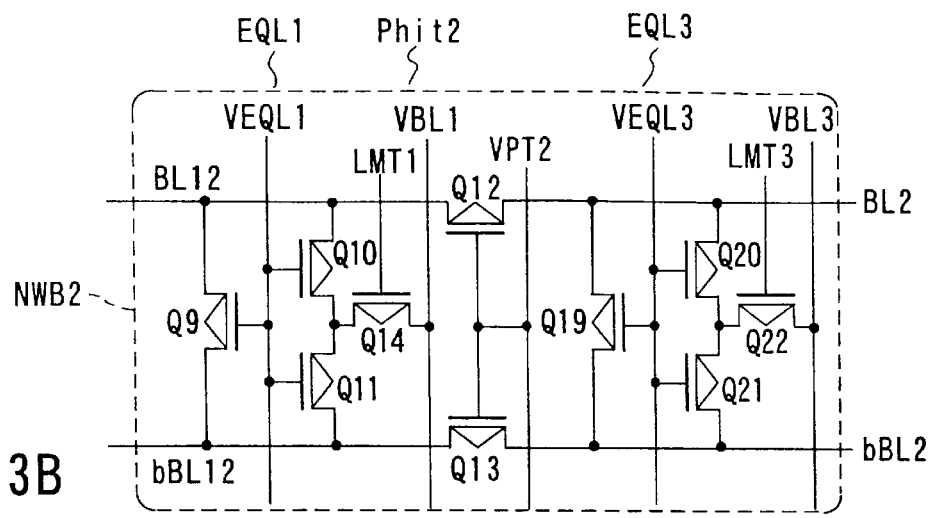
FIG. 13B shows an example of another circuit configuration of the n-type well NWB2 employed in the embodiment shown in FIG. 11.

FIGS. 13A and 13B illustrate an embodiment obtained by modifying the circuit configuration shown in FIGS. 12A and 12B. In the embodiment shown in FIGS. 13A and 13B, current-limiting PMOS transistors Q14, Q18 and Q22 are added to the three bit line equalizer circuits EQL1, EQL2 and EQL3, respectively, as in the embodiment shown in FIG. 8.

Figure 14A:
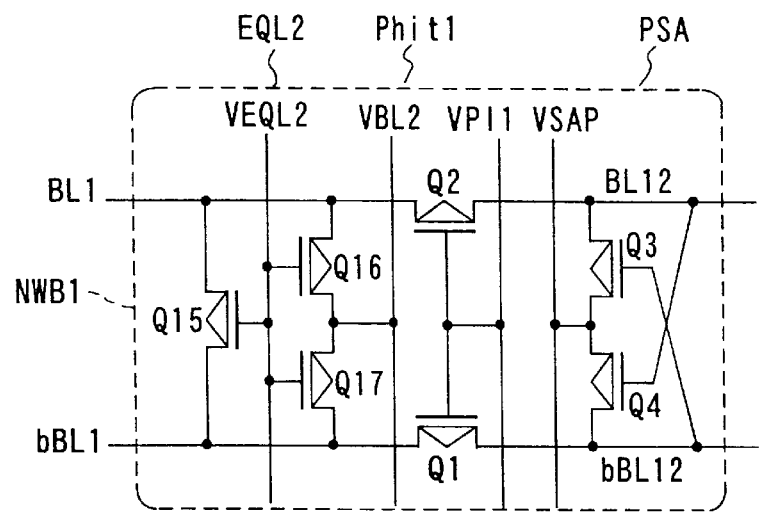
FIG. 14A shows an example of still another circuit configuration of the n-type well NWB1 employed in the embodiment shown in FIG. 11.
Figure 14B:
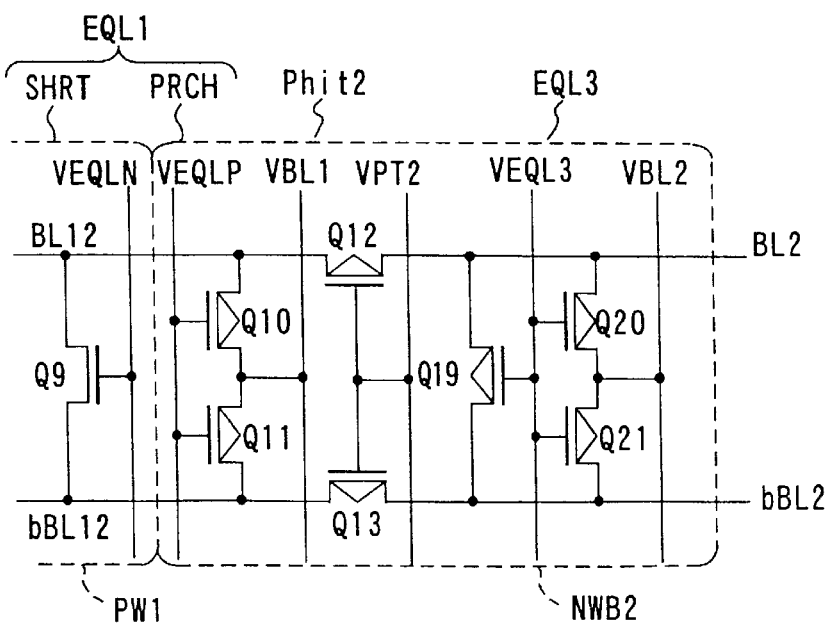
FIG. 14B shows an example of still another circuit configuration of the n-type well NWB2 employed in the embodiment shown in FIG. 11.

FIGS. 14A and 14B illustrate an embodiment obtained by modifying the circuit configuration shown in FIGS. 12A and 12B. In the embodiment shown in FIGS. 14A and 14B, the first bit line equalizer circuit EQL1 is formed in such a manner that it is located in both a p-type well PW1 and an n-type well NWB1, as in the embodiment shown in FIG. 9.

Figure 15A:
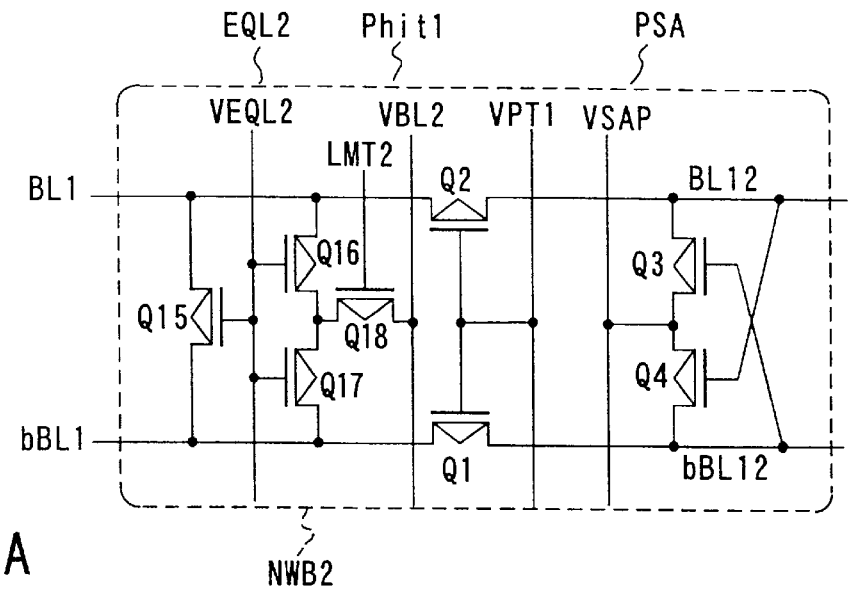
FIG. 15A shows an example of still another circuit configuration of the n-type well NWB1 employed in the embodiment shown in FIG. 11.
Figure 15B:
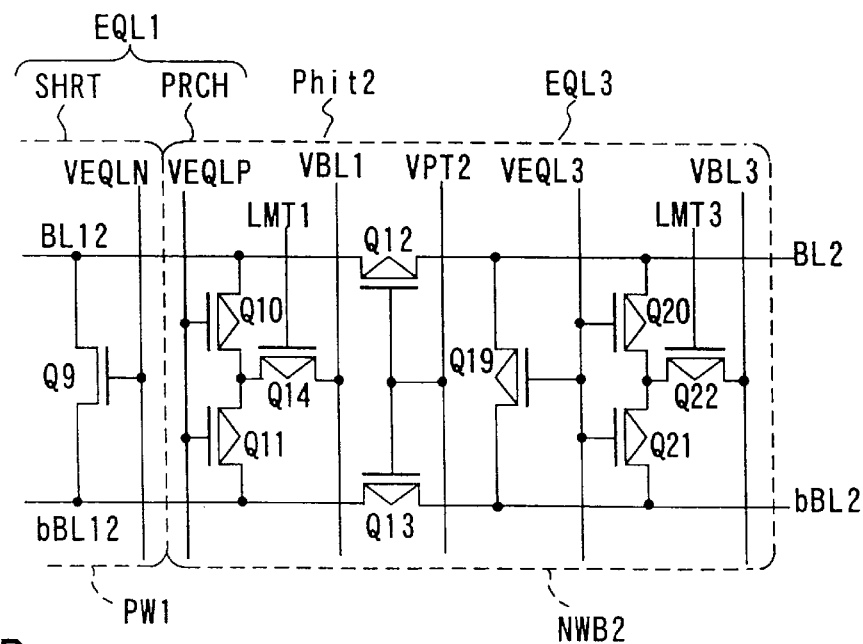
FIG. 15B shows an example of still another circuit configuration of the n-type well NWB2 employed in the embodiment shown in FIG. 11.

FIGS. 15A and 15B illustrate an embodiment obtained by modifying the circuit configuration shown in FIGS. 14A and 14B. In the embodiment shown in FIGS. 15A and 15B, current-limiting PMOS transistors Q14, Q18 and Q22 are added to the bit line equalizer circuits EQL1, EQL2 and EQL3, respectively.

Figure 16:
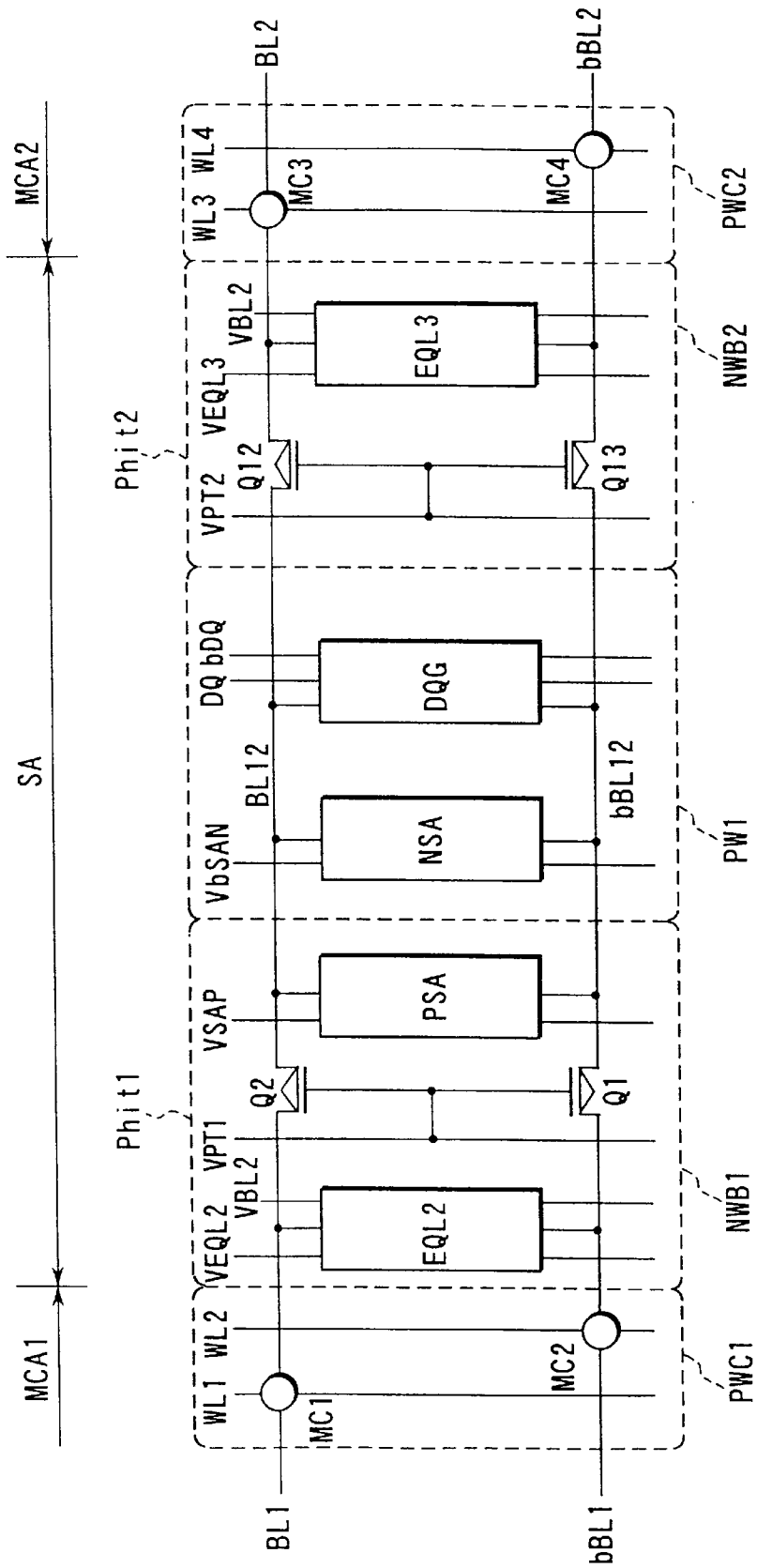
FIG. 16 shows a circuit configuration of the sense amplifier circuit region, which is according to still another embodiment of the present invention.

FIG. 16 shows an embodiment which differs from that shown in FIG. 11, in that the first bit line equalizer circuit EQL1 is omitted. In comparison with the bit lines BL1, bBL1, BL2 and bBL2 of the sub-cell arrays MCA1 and MCA2, the bit lines BL12 and bBL12 of the sense amplifier circuits region SA have very small capacitance. Therefore, if only the bit line equalizers EQL2 and EQL3 for the bit lines BL1, bBL1, BL2 and bBL2 of the sub-cell arrays MCA1 and MCA2 are provided, it is not necessary to arrange a bit line equalizer circuit EQL1 between the switch circuits Phit1 and Phit2, wherein the switch circuit Phit1 is turned on to equalize the bit lines BL1 and BL2 by means of the bit line equalizer circuit EQL2.

When data is read out from sub-cell array MCA1 shown in FIG. 16, for example, the equalizer EQL2 is turned off to amplify the data thus read out.

Figure 17:
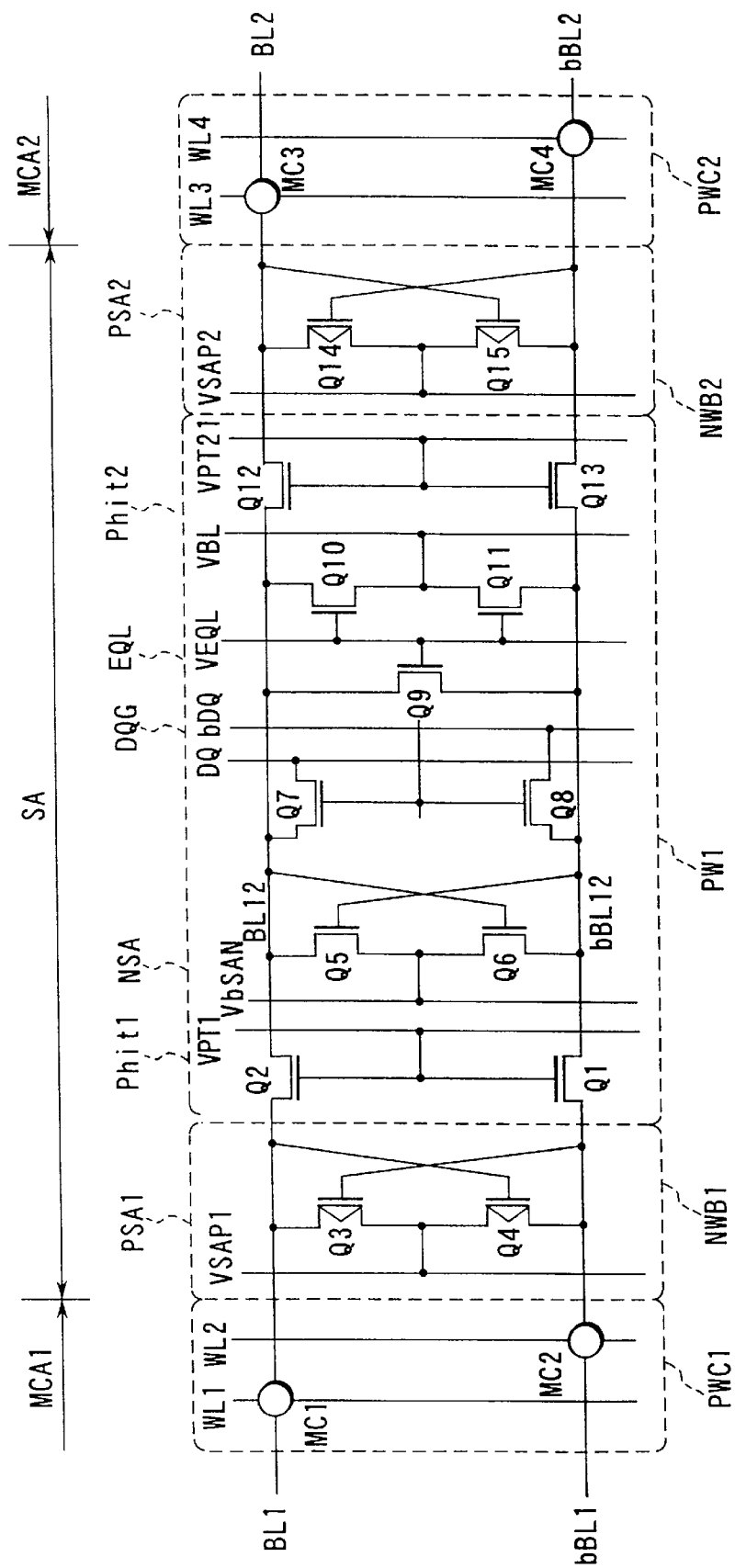
FIG. 17 shows a circuit configuration of the sense amplifier circuit region, which is according to still another embodiment of the present invention.

FIG. 17 shows an embodiment wherein the major circuits elements of a sense amplifier circuit region SA are made of NMOS transistors arranged in a p-type well PW1. Specifically, the p-type well PW1 contain not only an NMOS sense amplifier NSA and a column selection gate DQC but also a bit line equalizer circuit EQL and switch circuits Phit1 and Phit2. The switch circuits Phit1 and Phit2 are located at the respective ends of the p-type well PW1. In FIG. 17, the same reference symbols are used to denote the corresponding elements of the foregoing embodiments. It should be noted that the precharge MOS transistors Q10, Q11 and equalizer MOS transistor Q9 of the bit line equalizer circuit EQL, the MOS transistors Q1, Q2 of the switch circuit Phit1, and the MOS transistors Q12, Q13 of the switch circuit Phit2 are all n-channel types.

PMOS sense amplifiers PSAL and PSA2 are arranged in the n-type wells NWB1 and NWB2, respectively. In the embodiments described so far, each of the NMOS and PMOS sense amplifiers is shared by two sub-cell arrays MCA1 and MCA2. In the present embodiment, only the NMOS sense amplifier NSA is shared by the two sub-cell arrays MCA1 and MCA2, and the PMOS sense amplifiers are provided for the respective sub-cell arrays MCA1 and MCA2. To be more specific, the PMOS sense amplifier PSA1 is used for amplifying a signal on the higherpotential one of the bit lines BL1 and bBL1 of the sub-cell array MCA1, and the PMOS sense amplifier PSA2 is used for amplifying a signal on the higher-potential one of the bit lines BL2 and bBL2 of the sub-cell array MCA2. The NMOS sense amplifier NSA, on the other hand, is used for amplifying a signal on the lower-potential one of the bit lines of each of the sub-cell arrays MCA1 and MCA2.

In the case where the bit line equalizer circuit EQL is made of NMOS transistors, as in the present embodiment, the time needed for the equalizing operation is short because the NMOS transistors are superior to the PMOS transistors in terms of the current driving capability.

The circuit of the embodiment shown in FIG. 17 operates in a similar manner to that of the embodiment shown in FIG. 7 (wherein only one equalizer circuit EQL is provided), and a description of the operation of the embodiment in FIG. 17 will be omitted.

Figure 18:
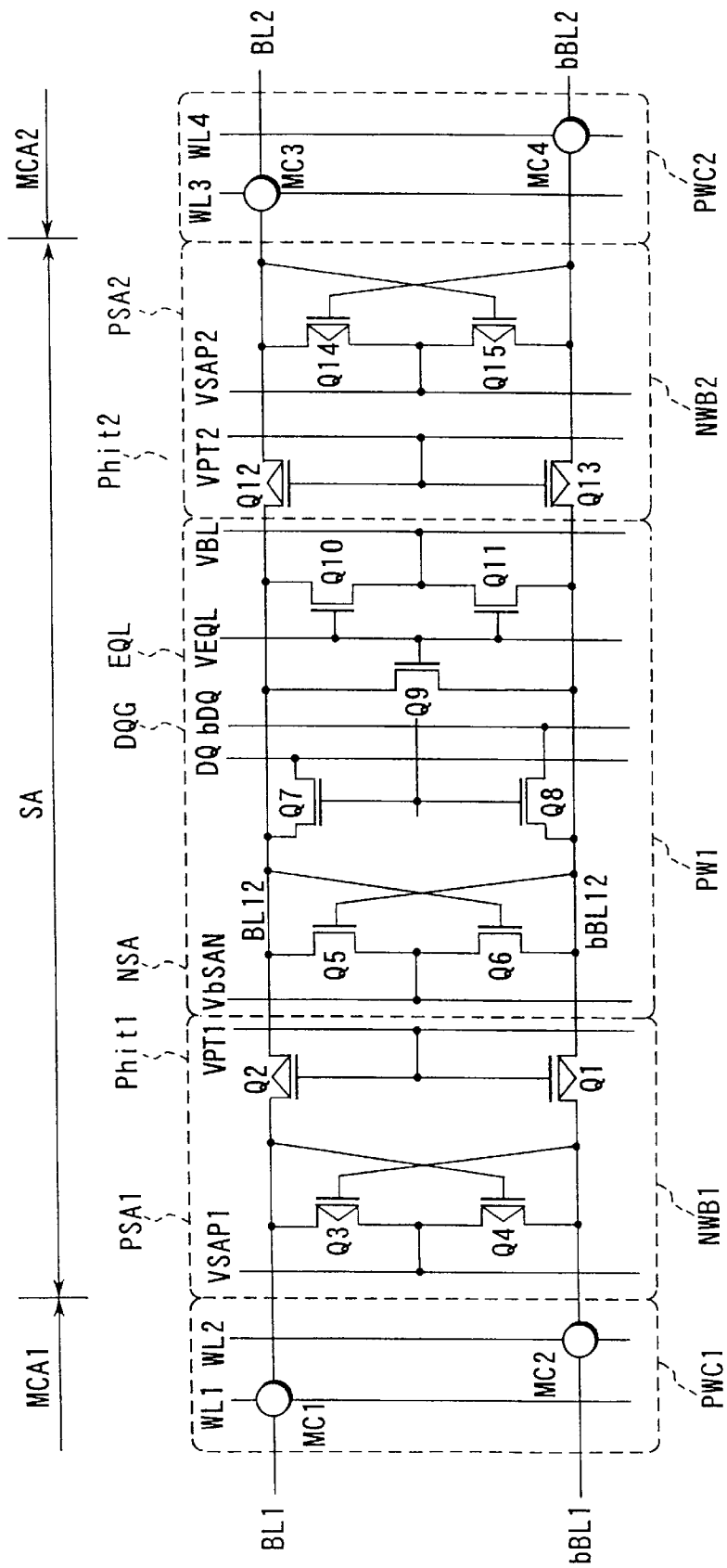
FIG. 18 shows a circuit configuration of the sense amplifier circuit region, obtained by modifying the embodiment shown in FIG. 17.

FIG. 18 illustrates an embodiment obtained by modifying the embodiment shown in FIG. 17. In the embodiment shown in FIG. 18, the switch circuits Phit1 and Phit2 are each made of PMOS transistors, and are formed in N-type wells NWB1 and NWB2, respectively.

Figure 19:
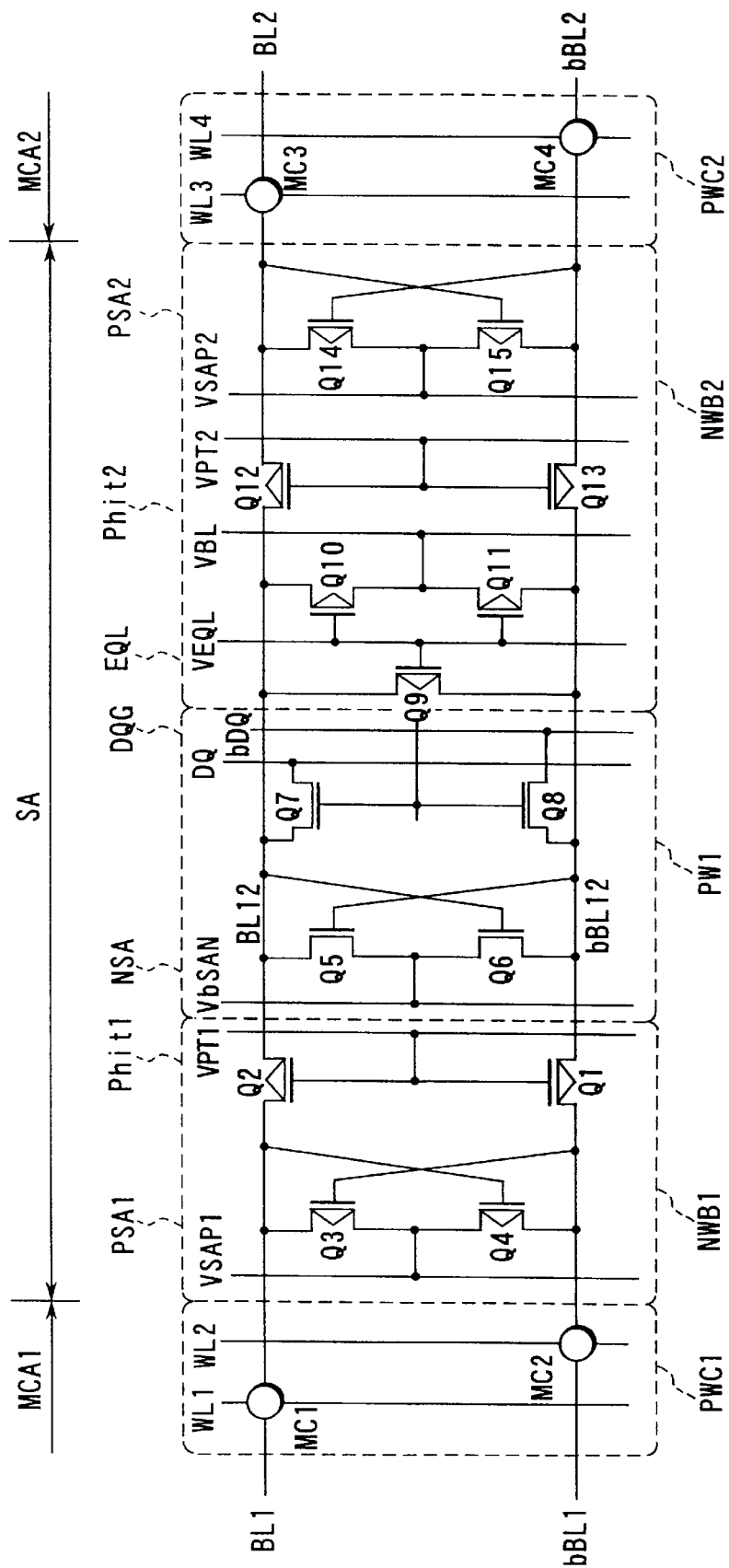
FIG. 19 shows a circuit configuration of the sense amplifier circuit region, obtained by modifying the embodiment shown in FIG. 18.

FIG. 19 illustrates an embodiment obtained by modifying the embodiment shown in FIG. 18. In the embodiment shown in FIG. 19, a bit line equalizer circuit EQL, which is similar to that of the FIG. 18 embodiment, is made of PMOS transistors Q9, Q10 and Q11 and arranged in an n-type well NWB2.

Figure 20:
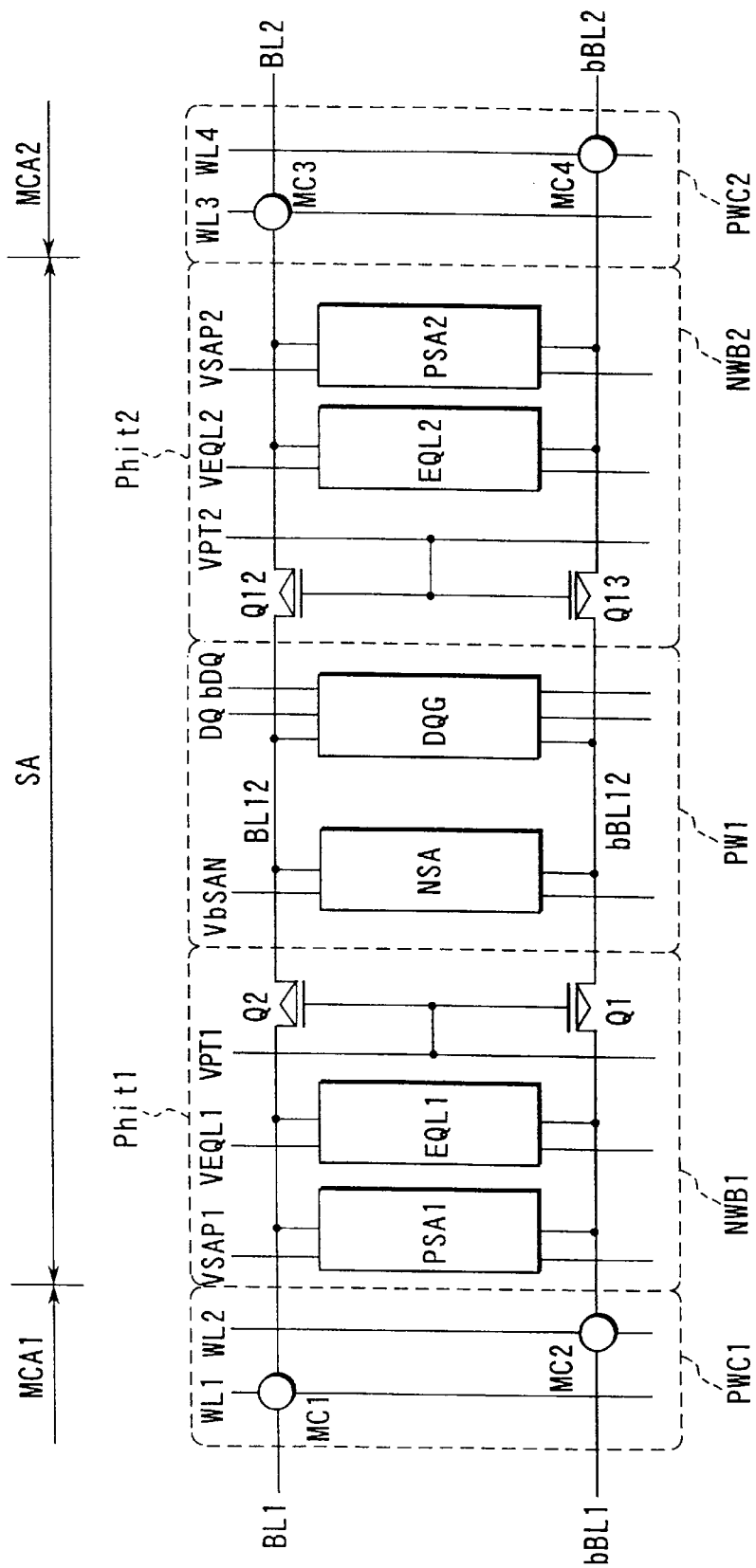
FIG. 20 shows a circuit configuration of the sense amplifier circuit region, which is according to still another embodiment of the present invention.

FIG. 20 illustrates an embodiment obtained by modifying the embodiment shown in FIG. 19. In the embodiment shown in FIG. 20, bit line equalizer circuits EQL1 and EQL2, each made of PMOS transistors, are arranged on the outer sides of the respective switch circuits Phit1 and Phit2. The technical idea underlying this structure is similar to that of the embodiment shown in FIG. 16.

Figure 21:
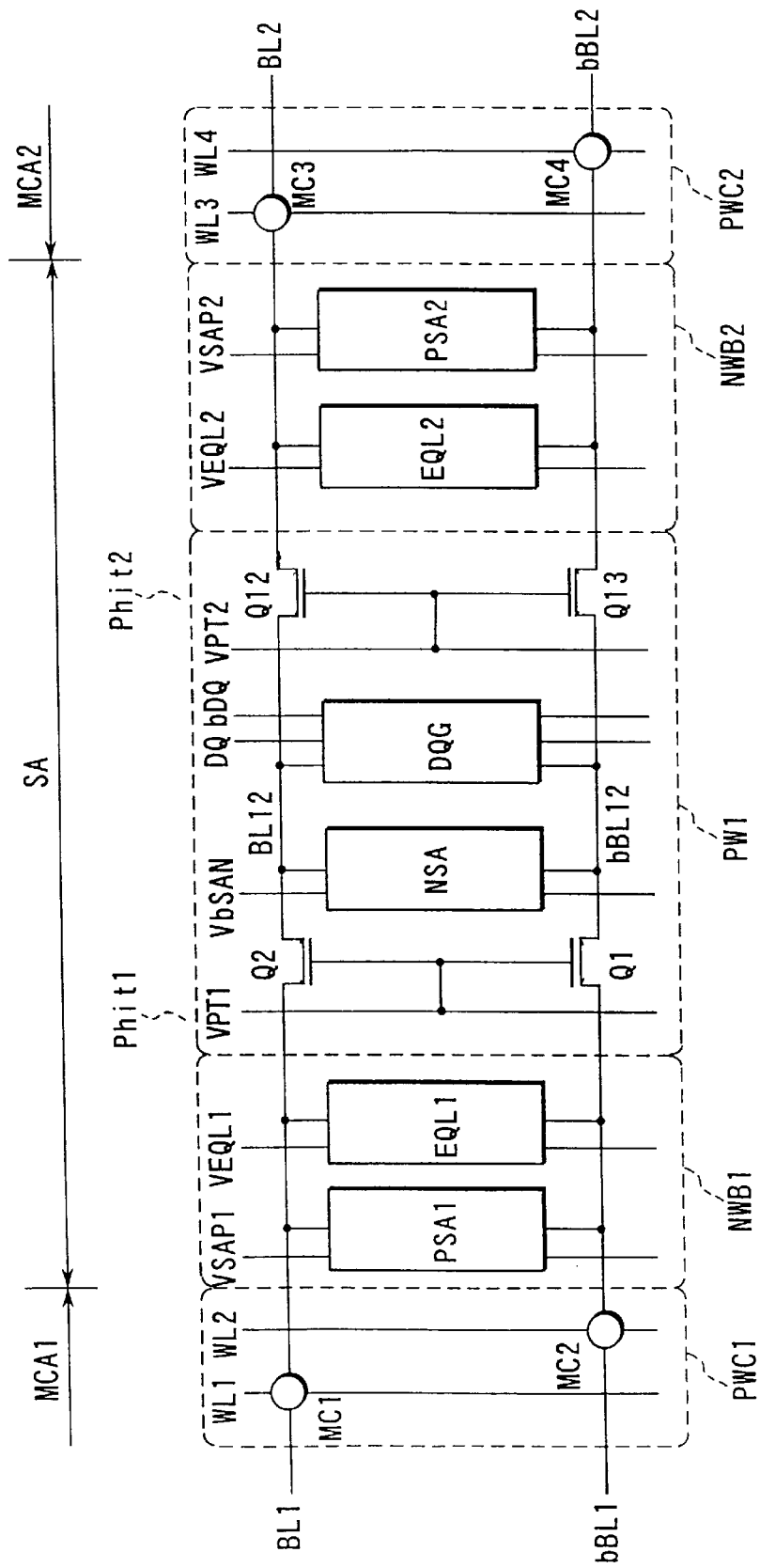
FIG. 21 shows a circuit configuration of the sense amplifier circuit region, obtained by modifying the embodiment shown in FIG. 20.

FIG. 21 illustrates an embodiment obtained by modifying the embodiment shown in FIG. 20. In the embodiment shown in FIG. 21, switch circuits Phit1 and Phit2 arranged in n-type wells NWB1 and NWB2 (such as the switch circuits employed in the FIG. 20 embodiment) are each made NMOS transistors and are arranged in the end portions of the p-type well PW1. In the case of the embodiment shown in FIG. 21, the equalizer MOS transistor of each of the bit line equalizer circuits EQL1 and EQL2 may be an NMOS transistor formed in a p-type well PW1.

Figure 22:
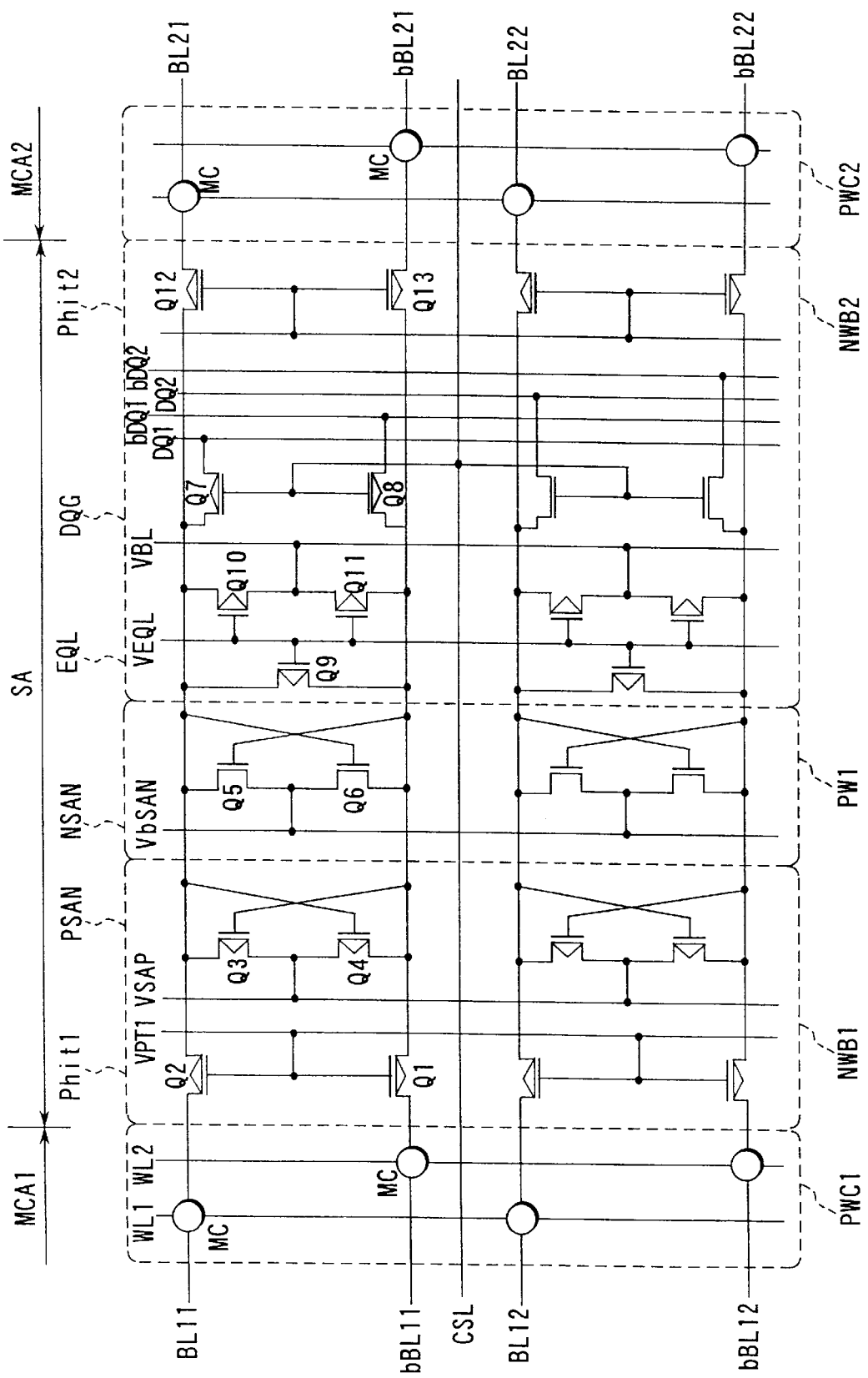
FIG. 22 shows a circuit configuration of the sense amplifier circuit region, obtained by modifying the embodiment shown in FIG. 7.

FIG. 22 illustrates an embodiment obtained by modifying the embodiment shown in FIG. 7. In the embodiment shown in FIG. 22, the MOS transistors Q7a, Q8a, Q7b and Q8b of column selection gates DQG are p-channel types arranged in an n-type well NWB2. In the circuit shown in FIG. 22, the column selection gates, which are made of four MOS transistors Q7a, Q8a, Q7b and Q8b and correspond to two columns, are driven by a single column selection line CSL, and data corresponding to the two columns are transferred to two pairs of data lines (DQ1, bDQ1; DQ2, bDQ2).

Figure 23:
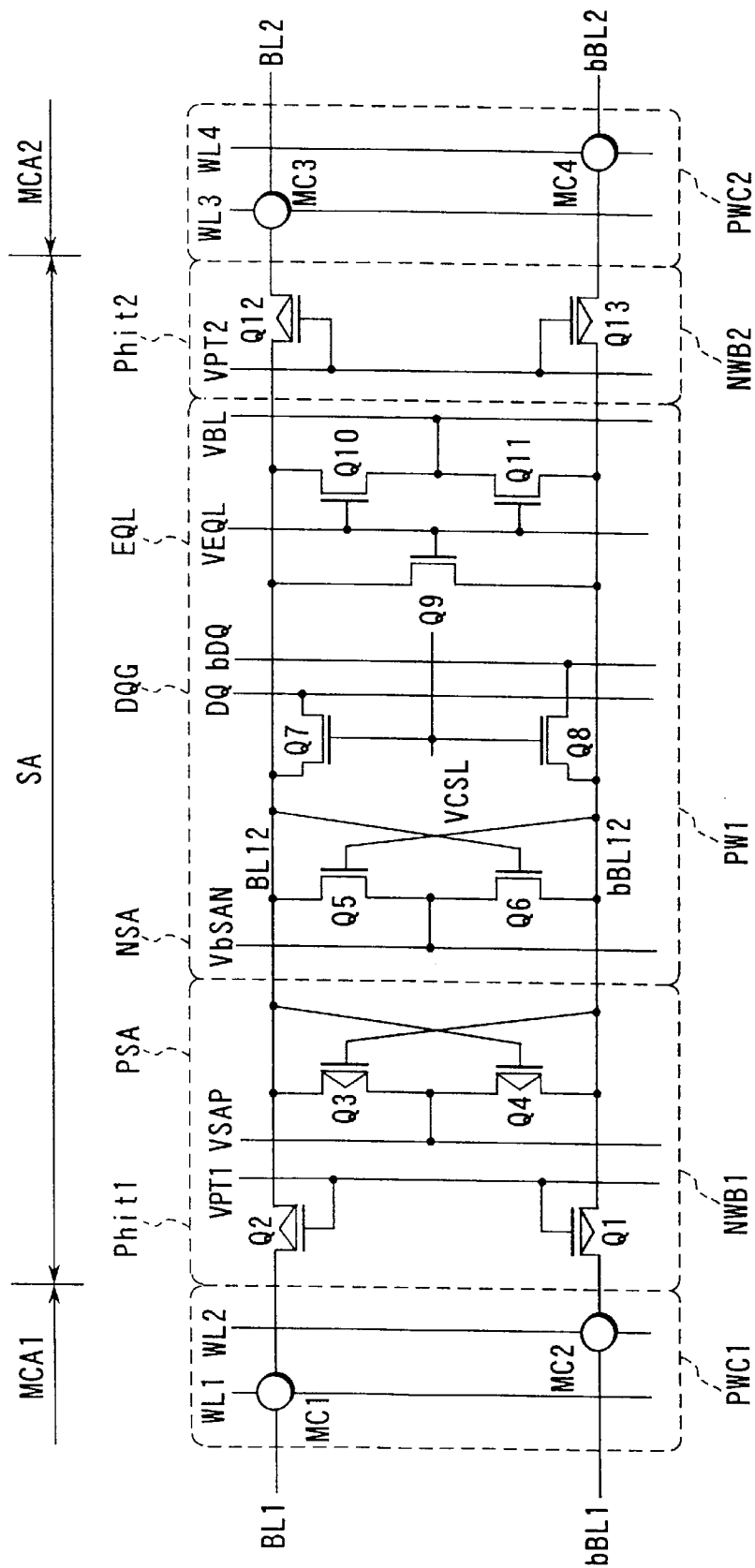
FIG. 23 shows a circuit configuration of the sense amplifier circuit region, obtained by modifying the embodiment shown in FIG. 7.

FIG. 23 illustrates an embodiment obtained by modifying the embodiment shown in FIG. 7. In the embodiment shown in FIG. 23, the precharge MOS transistors Q10 and Q11 and equalizer MOS transistor Q9 of the bit line equalizer circuit EQL are all made of n-channel types arranged in a p-type well PW1. Except for this point, the embodiment shown in FIG. 23 is similar to that shown in FIG. 7.

Figures 24, 25:
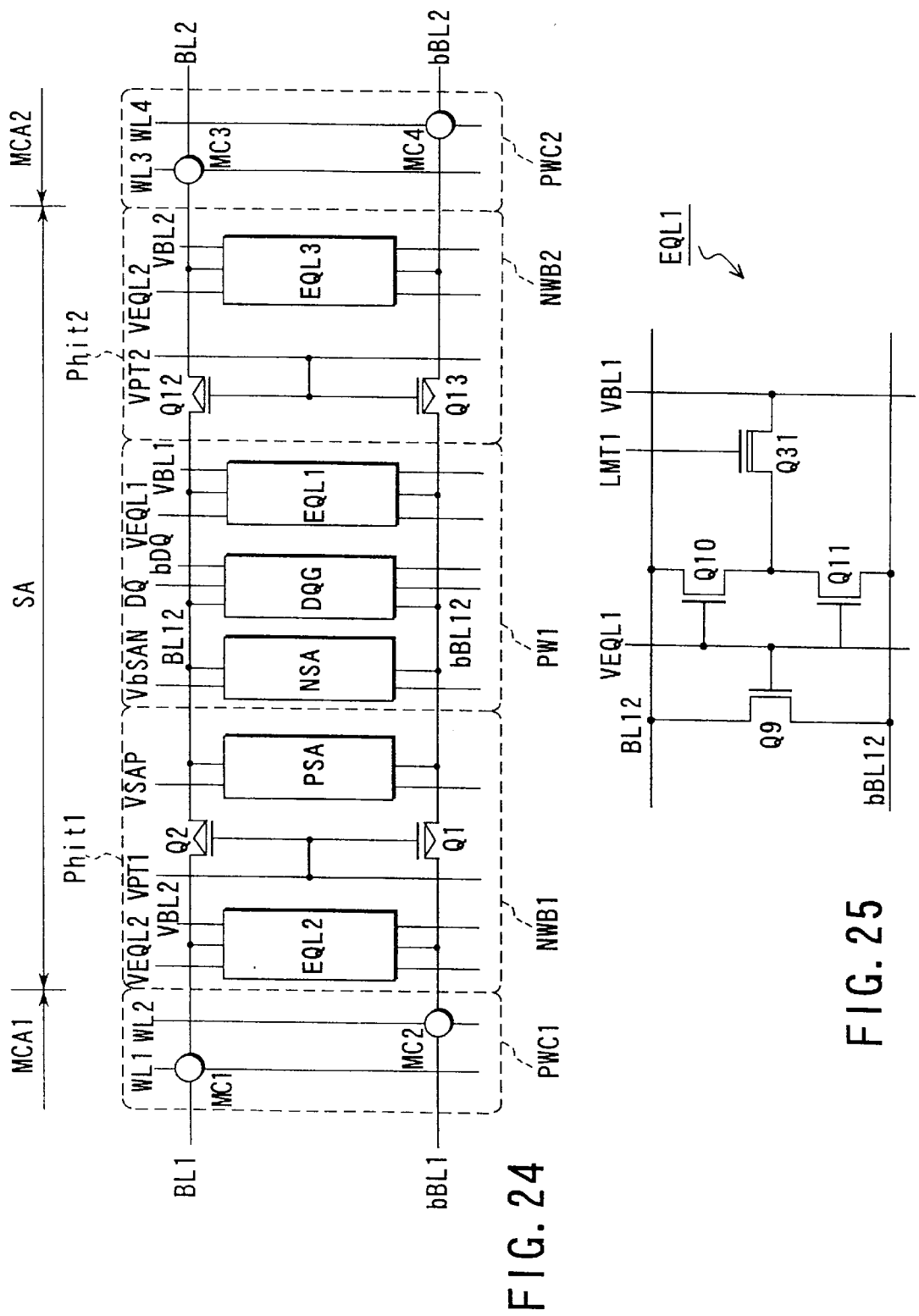
FIG. 24 shows a circuit configuration of the sense amplifier circuit region, which is according to still another embodiment of the present invention.
FIG. 25 shows a circuit configuration of the bit line equalizer circuit EQL1 employed in the embodiment shown in FIG. 24.

FIG. 24 illustrates an embodiment obtained by modifying the embodiment shown in FIG. 11. In the embodiment shown in FIG. 24, the bit line equalizer circuit EQL1, which is used for precharging or equalizing the bit lines BL12 and bBL12 of the sense amplifier circuit SA, is made of NMOS transistors, as in the embodiment shown in FIG. 23, and the NMOS transistors are arranged in a p-type well PW1.

The circuit arrangement of the embodiment shown in FIG. 24 is featured in that bit equalizer circuits EQL2 and EQL3 are located closer to sub-cell arrays MCA1 and MCA2 than switch circuits Phit1 and Phit2, respectively. With this structure, the bit lines BL1, bBL1, BL2 and bBL2 of the sub-cell arrays MCA1 and MCA2 and the bit lines BL12 and bBL12 of the sense amplifier circuit region SA can be precharged and equalized independently of each other. This precharging and equalizing operations are performed, with the switch circuits Phit1 and Phit2 are kept off. In the embodiment shown in FIG. 24, the bit lines BL12 and bBL12 of the sense amplifier circuit region are precharged and equalized. In comparison with the embodiment shown in FIG. 21, therefore, the embodiment shown in FIG. 24 is advantageous in that high speed operation of the sense amplifier is ensured.

In the embodiment shown in FIG. 24, current-limiting MOS transistors can be added to the bit line equalizer circuits EQL1, EQL2 and EQL3, respectively. To be more specific, in regard to the bit line equalizers EQL2 and EQL3 made of PMOS transistors, current-limiting circuits made of PMOS transistors are added to them in a similar manner to that shown in FIGS. 13A and 13B. As for the bit line equalizer circuits EQL1 made of NMOS transistors, a D-type NMOS transistor Q31 can be employed as the current-limiting transistor to be inserted between the precharge NMOS transistors Q10 and Q11 and the precharge power supply line VBL. For example, where the NMOS transistor Q31 is a D-type transistor having a small negative threshold value, the control signal line LMT1 connected to the gate of that transistor may be 0 V, which leads to high-resistance constant current characteristic.

The bit equalizer circuit EQL of the embodiment shown in FIG. 23 can be provided with a current-limiting circuit in a similar manner to that of FIG. 25.

As described above, according to the present invention, three wells are arranged in the sense amplifier circuit region between two adjacent sub-cell arrays. All these wells are utilized to provide a sense amplifier circuit, a bit line equalizer circuit, a switching circuit, etc. Accordingly, the circuit arrangement can be optimized, the well structure of the semiconductor memory device is simple, and efficient use of the chip area is enabled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device including a memory cell array divided into a plurality of sub-cell arrays, and a sense amplifier circuit arranged between adjacent ones of the sub-cell arrays, comprising:

a first one-conductivity-type well in which a first sub-cell array is formed;

a second one-conductivity-type well in which a second sub-cell array adjacent to said first sub-cell array is formed; and a sense amplifier circuit formation region in which said sense amplifier circuit is formed, said region being formed between said first and second one-conductivity-type wells, and said region including a third one-conductivity-type well and a first and second opposite-conductivity-type wells arranged to sandwich the third one-conductivity-type well, wherein said third one-conductivity-type well is isolated from said first and second one-conductivity-type wells by said first and second opposite-conductivity-type wells.

2. A semiconductor memory device according to claim 1, wherein said sense amplifier circuit comprises:

a first sense amplifier made of at least one opposite-conductivity-type MOS transistor formed in the third one-conductivity-type well; and a second sense amplifier made of at least one one-conductivity-type MOS transistor formed at least in one of the first and second opposite-conductivity-type wells.

3. A semiconductor memory device according to claim 2, further comprising switch circuits for connecting/disconnecting the sense amplifier circuit to/from the first and second sub-cell arrays, said switch circuits being made of one-conductivity-type MOS transistors which are respectively formed in the first and second opposite-conductivity-type wells.

4. A semiconductor memory device according to claim 2, further comprising switch circuits for connecting/disconnecting the first sense amplifier to/from the first and second sub-cell arrays, said switch circuits being made of one-conductivity-type MOS transistors which are located outside the first sense amplifier of the third one-conductivity-type well.

5. A semiconductor memory device according to claim 3, wherein the first and second sense amplifiers are sandwiched between the switch circuits.

6. A semiconductor memory device according to claim 4, wherein the first and second sense amplifiers are sandwiched between the switch circuits.

7. A semiconductor memory device according to claim 3, wherein said first sense amplifier is sandwiched between the switch circuits, and said second sense amplifier includes two sense amplifier elements which are respectively located between the switch circuits and corresponding ones of the sub-cell arrays.

8. A semiconductor memory device according to claim 4, wherein said first sense amplifier is sandwiched between the switch circuits, and said second sense amplifier includes two sense amplifier elements which are respectively located between the switch circuits and corresponding ones of the sub-cell arrays.

9. A semiconductor memory device according to claim 3, further comprising a bit line equalizer circuit which is sandwiched between the switch circuits and formed in one of the first opposite-conductivity-type well, the second opposite-conductivity-type well and the third one-conductivity-type well.

10. A semiconductor memory device according to claim 4, further comprising a bit line equalizer circuit which is sandwiched between the switch circuits and formed in one of the first opposite-conductivity-type well, the second opposite-conductivity-type well and the third one-conductivity-type well.

11. A semiconductor memory device according to claim 3, further comprising a plurality of bit line equalizer circuits which are respectively arranged between the switch circuits and corresponding ones of the sub-cell arrays.

12. A semiconductor memory device according to claim 4, further comprising a plurality of bit line equalizer circuits which are respectively arranged between the switch circuits and corresponding ones of the sub-cell arrays.

13. A semiconductor memory device according to claim 9, wherein said bit line equalizer circuit comprises:

a pair of precharge MOS transistors, having gates driven by a signal supplied from an equalizing signal line, for transferring potentials of a precharge power supply line to a pair of bit lines; and an equalizer MOS transistor, having a gate driven by a signal supplied from the equalizing signal line, for short-circuiting the bit lines.

14. A semiconductor memory device according to claim 10, wherein said bit line equalizer circuit comprises:

a pair of precharge MOS transistors, having gates driven by a signal supplied from an equalizing signal line, for transferring potentials of a precharge power supply line to a pair of bit lines; and an equalizer MOS transistor, having a gate driven by a signal supplied from the equalizing signal line, for short-circuiting the bit lines.

15. A semiconductor memory device according to claim 11, wherein each of said bit line equalizer circuits comprises:

a pair of precharge MOS transistors, having gates driven by a signal supplied from an equalizing signal line, for transferring potentials of a precharge power supply line to a pair of bit lines; and an equalizer MOS transistor, having a gate driven by a signal supplied from the equalizing signal line, for short-circuiting the bit lines.

16. A semiconductor memory device according to claim 12, wherein each of said bit line equalizer circuits comprises:

a pair of precharge MOS transistors, having gates driven by a signal supplied from an equalizing signal line, for transferring potentials of a precharge power supply line to a pair of bit lines; and an equalizer MOS transistor, having a gate driven by a signal supplied from the equalizing signal line, for short-circuiting the bit lines.

17. A semiconductor memory device according to claim 9, wherein said bit line equalizer circuit comprises:

a pair of precharge MOS transistors, having gates driven by a signal supplied from an equalizing signal line, for transferring potentials of a precharge power supply line to a pair of bit lines;

an equalizer MOS transistor, having a gate driven by a signal supplied from the equalizing signal line, for short-circuiting the bit lines; and a current-limiting MOS transistor inserted between the precharge MOS transistors and the precharge power supply line.

18. A semiconductor memory device according to claim 10, wherein said bit line equalizer circuit comprises:

a pair of precharge MOS transistors, having gates driven by a signal supplied from an equalizing signal line, for transferring potentials of a precharge power supply line to a pair of bit lines;

an equalizer MOS transistor, having a gate driven by a signal supplied from the equalizing signal line, for short-circuiting the bit lines; and a current-limiting MOS transistor inserted between the precharge MOS transistors and the precharge power supply line.

19. A semiconductor memory device according to claim 11, wherein each of said bit line equalizer circuits comprises:

a pair of precharge MOS transistors, having gates driven by a signal supplied from an equalizing signal line, for transferring potentials of a precharge power supply line to a pair of bit lines;

an equalizer MOS transistor, having a gate driven by a signal supplied from the equalizing signal line, for short-circuiting the bit lines; and a current-limiting MOS transistor inserted between the precharge MOS transistors and the precharge power supply line.

20. A semiconductor memory device according to claim 12, wherein each of said bit line equalizer circuits comprises:

a pair of precharge MOS transistors, having gates driven by a signal supplied from an equalizing signal line, for transferring potentials of a precharge power supply line to a pair of bit lines;

an equalizer MOS transistor, having a gate driven by a signal supplied from the equalizing signal line, for short-circuiting the bit lines; and a current-limiting MOS transistor inserted between the precharge MOS transistors and the precharge power supply line.

* * * * *